(12) United States Patent
Yang et al.

(10) Patent No.: US 9,083,320 B2
(45) Date of Patent: Jul. 14, 2015

(54) APPARATUS AND METHOD FOR ELECTRICAL STABILITY COMPENSATION

(71) Applicants: Maofeng Yang, Waterloo (CA); Nikolas Papadopoulos, Waterloo (CA); William Wong, Waterloo (CA); Manoj Sachdev, Waterloo (CA)

(72) Inventors: Maofeng Yang, Waterloo (CA); Nikolas Papadopoulos, Waterloo (CA); William Wong, Waterloo (CA); Manoj Sachdev, Waterloo (CA)

(*) Notice: Subject to any disclaimer, the term of this patent is extended or adjusted under 35 U.S.C. 154(b) by 0 days.

(21) Appl. No.: 14/032,849

(22) Filed: Sep. 20, 2013

(65) Prior Publication Data

US 2015/0084538 A1   Mar. 26, 2015

(51) Int. Cl.
*H05B 37/02* (2006.01)
*H05B 39/04* (2006.01)
*H03K 3/012* (2006.01)
*H05B 33/08* (2006.01)

(52) U.S. Cl.
CPC ............ *H03K 3/012* (2013.01); *H05B 33/0896* (2013.01)

(58) Field of Classification Search
None
See application file for complete search history.

(56) References Cited

U.S. PATENT DOCUMENTS

| | | | |
|---|---|---|---|
| 6,373,454 B1 | 4/2002 | Knapp et al. | |
| 6,384,804 B1 | 5/2002 | Dodabalapur et al. | |
| 7,310,077 B2 | 12/2007 | Kane | |
| 7,569,849 B2 | 8/2009 | Nathan et al. | |
| 7,760,164 B2 | 7/2010 | Shin | |
| 8,188,946 B2 | 5/2012 | Nathan et al. | |
| 8,228,268 B2 | 7/2012 | Mori et al. | |
| 8,242,983 B2 | 8/2012 | Yoo et al. | |
| 8,274,503 B2 | 9/2012 | Kwon | |
| 8,325,111 B2 | 12/2012 | Kimura | |
| 8,354,981 B2 | 1/2013 | Kawasaki et al. | |
| 8,373,628 B2 | 2/2013 | Fish | |
| 2009/0284519 A1* | 11/2009 | Kim et al. | ..................... 345/213 |
| 2011/0130981 A1 | 6/2011 | Chaji et al. | |

OTHER PUBLICATIONS

Y. He et al., "Four-Thin Film Transistor Pixel Electrode Circuits for Active-Matrix Organic Light-Emitting Displays," Japanese Journal of Applied Physics Part 1—Regular Papers Short Notes and Review Papers, vol. 40, pp. 1199-1208, 2001.
A. Nathan et al., "Driving Schemes for a-Si and LTPS AMOLED Displays," IEEE Journal of Display Technology, vol. 1, pp. 267-277, 2005.
J. Goh et al., "P-72: A Novel Pixel Circuit for Active-Matrix Organic Light-Emitting Diodes," in SID Symposium Digest of Technical Papers, 2003, p. 494-497.
N. P. Papadopoulos et al., "An Improved Optical Feedback Pixel Driver Circuit," IEEE Transactions on Electron Devices, vol. 56, pp. 229-235, 2009.
G. R. Chaji et al., "Stable RGBW AMOLED display with OLED degradation compensation using electrical feedback," in IEEE International Solid-State Circuits Conference ISSCC, 2010, pp. 118-120.

(Continued)

Primary Examiner — Jany Richardson
(74) Attorney, Agent, or Firm — Gowling Lafleur Henderson LLP; Neil Henderson

(57) ABSTRACT

Provided is an apparatus and method for electrical stability compensation. The apparatus includes a drive transistor connecting a power supply to a load, a first variable capacitor having a gate and a source, and a switch transistor for controlling a connection between a programming signal source and a gate of the drive transistor. The gate of the first variable capacitor is connected to the gate of the drive transistor. The first variable capacitor is configured to draw a charge from the gate of the drive transistor during a driving phase for the load.

17 Claims, 26 Drawing Sheets

(56) References Cited

OTHER PUBLICATIONS

T. Hasumi et al., "46.2 New OLED Pixel Circuit and Driving Method to Suppress Threshold Voltage Shift of a-Si:H TFT," in SID Symposium Digest of Technical Papers, 2006, p. 1547-1550.

M. Yang et al., "A Novel 4-TFT Pixel Circuit with Threshold Voltage Compensation for AMOLED Displays", 2012 IEEE Photonics Conference (IPC 2012), Sep. 23-27, 2012, pp. 516-517.

* cited by examiner

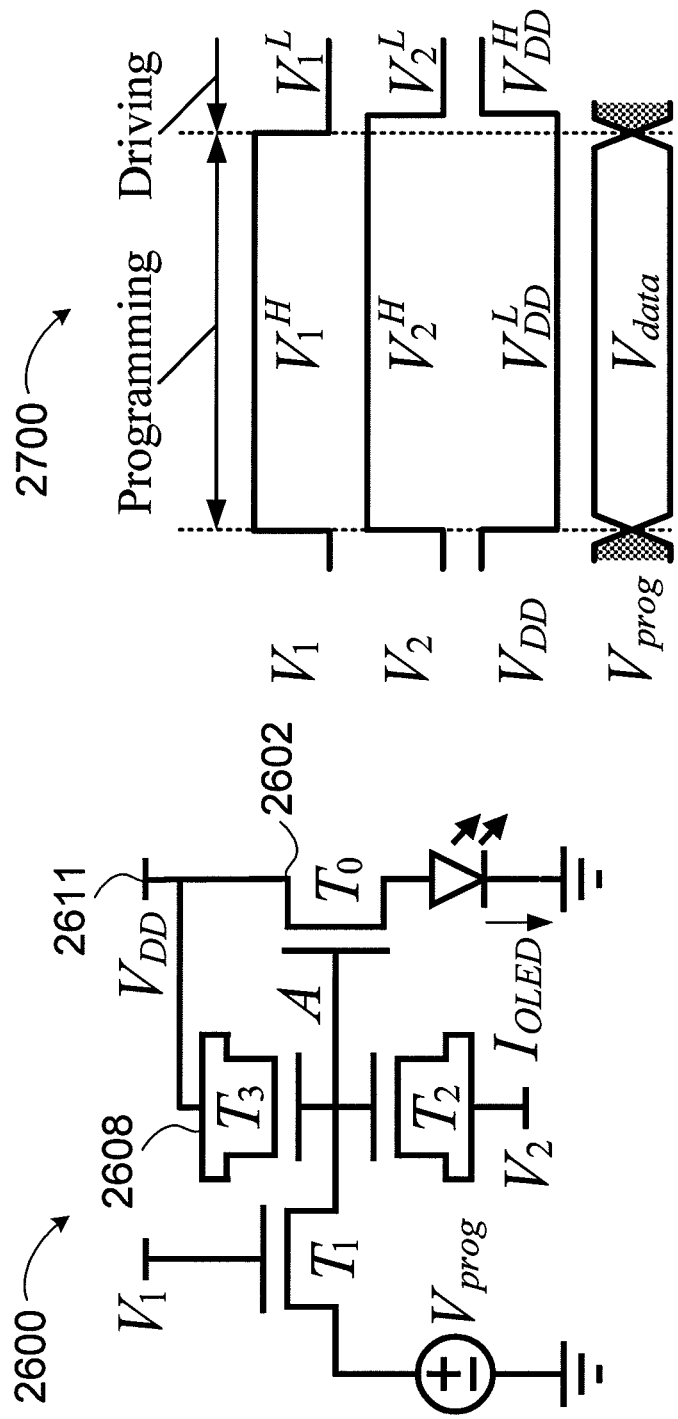

APPARATUS AND METHOD FOR ELECTRICAL STABILITY COMPENSATION

FIELD

The present disclosure relates generally to electrical stability compensation. More particularly, the present disclosure relates to an apparatus and method for electrical stability compensation.

BACKGROUND

Transistors, for example, thin-film transistors (TFTs), may be made using inorganic or organic materials such as amorphous silicon, polycrystalline silicon, nano-crystalline silicon, zinc oxide (ZnO), InGaZnO, pBTTT polymers, etc. In many cases, the transistor may be subject to degradation over time, causing instability in the transistor's operation. Degradation and/or instability of a transistor could be caused by various factors, such as electrical stress, light exposure, mechanical strain/stress, environment temperature and moisture etc. In particular, degradation of a transistor can cause instability in the provision of current to a load that is connected to the transistor.

For example, in light emitting displays, such as light emitting diode (LED) displays or organic light emitting diode (OLED) displays, degradation of the transistor driving a light-emitting device may result in inconsistent light-emitting device drive current, and, as a result, inconsistent brightness of the light-emitting device. The resulting degradation of the brightness of the light-emitting device may reduce the lifetime of the display and cause visual non-uniformities in the display.

Electrical instability of a transistor may be characterized as current fluctuation and/or a threshold voltage shift ($V_T$-shift, $\Delta V_T$). A conventional simple voltage programmed two-transistor pixel circuit may not fully compensate for light emitting device current instability caused by $\Delta V_T$ of the drive transistor due to electrical stress. Therefore, it is desirable to compensate $\Delta V_T$ so as to stabilize the drive current provided by the drive transistor to the load.

In a display, voltage compensation can be used to compensate for the degradation of the drive transistor to minimize the instability of the drive current provided from the drive transistor to the light-emitting device. It will be understood that voltage compensation may also be useful in steady state lighting and other situations where a stable drive current is needed.

There are known methods and circuits for compensating for threshold voltage shift of a drive transistor. However, these conventional methods have limitations.

In displays, conventional $\Delta V_T$-compensation methods include current programming methods and voltage programming methods. The current programming methods typically use two transistors in series with an electroluminescent device, causing higher static power consumption. The higher power consumption may be undesirable in some applications of displays, such as portable electronics, where power consumption is critical to battery life. The relatively slow programming speed of conventional programming methods can limit the size of the display and programming speed may be particularly slow for smaller programming currents and/or larger display sizes.

On the other hand, voltage programming methods typically use specialized cycles during a programming phase to compensate for electrical instability but require longer programming times, complicated control signals, and complicated external drivers. Limited $\Delta V_T$-generation speed results in a lower programming speed. Since more than one transistor is typically used in the current path of the light-emitting device, higher power is consumed. The increased power consumption may be undesirable in low-power applications such as AMOLED displays in portable electronics. Control signals may be complicated and increase the complexity of the external driver.

Conventional circuits for $\Delta V_T$-compensation can also include optical feedback provided by a photo-sensor to correct the decay of OLED luminance. The photo-sensor may complicate the pixel circuit and take up pixel area, resulting in lower aperture ratio and resolution. Instability of the photo-sensor and light interference from the environment and neighbouring pixels may also cause errors in the feedback loop.

Conventional pixel circuits for $\Delta V_T$ compensation may also use an external driver (e.g. a complementary metaloxidesemiconductor (CMOS) driver) to detect and correct the $\Delta V_T$ of the drive transistor. External drivers may be intended to compensate for $\Delta V_T$ but these approaches are complicated. Methods using external drivers to detect and compensate for $\Delta V_T$ of the drive transistors generally have limited compensation resolution. The number of pixels which can be monitored by the external driver is limited by the pixel measurement speed, so the resolution of $\Delta V_T$-compensation is limited.

It is, therefore, desirable to provide an improved apparatus and method for electrical stability compensation.

SUMMARY

It is an object of the present disclosure to obviate or mitigate at least one disadvantage of conventional systems.

The apparatus and method are intended to compensate for electrical instability of a drive transistor and are also intended to have at least one of faster programming speed, simplified control signals, simplified circuit structure, and lower static power consumption. These aspects are intended to provide improvement over conventional apparatus and methods.

More particularly, the apparatus and method herein are intended to enable a voltage-programmed pixel circuit for light-emitting displays to allow compensation of electrical instability of transistors driving a light-emitting device in a pixel. These aspects are intended to provide improvement over conventional apparatus and methods, in particular for AMOLED displays, and large-area displays.

In a first aspect, the present disclosure provides an apparatus for electrical stability compensation including a drive transistor connecting a power supply to a load, a first variable capacitor having a gate and a source, and a switch transistor for controlling a connection between a programming signal source and a gate of the drive transistor. The gate of the first variable capacitor is connected to the gate of the drive transistor and the first variable capacitor is configured to draw a charge from the gate of the drive transistor during a driving phase for the load.

In a further aspect, the apparatus includes a second variable capacitor having a gate and a source. The gate of the second variable capacitor is connected to the gate of the drive transistor and the variable capacitor is configured to inject a charge to the gate of the drive transistor during the driving phase.

In a further aspect, the first variable capacitor includes a transistor in which a source and a drain are shorted. In a further aspect, the transistor is an asymmetrical transistor.

In a further aspect, the first variable capacitor includes a capacitor and a transistor wherein the capacitor is connected between a source and gate of the transistor and a gate of the transistor is connected to the gate of the drive transistor.

In a further aspect, the gate and source of the first variable capacitor are determined based on a dependence of the capacitance of the first variable capacitor to the gate to source voltage and the threshold voltage.

In a further aspect, the second variable capacitor includes a transistor in which a source and a drain are shorted. In a further aspect, the transistor is an asymmetrical transistor.

In a further aspect, the second variable capacitor includes a capacitor and a transistor wherein the capacitor is connected between a source and gate of the transistor and a gate of the transistor is connected to the gate of the drive transistor.

In a further aspect, the gate and source of the second variable capacitor are determined based on a dependence of the capacitance of the first variable capacitor to the gate to source voltage and the threshold voltage.

In a further aspect, the drive transistor is an asymmetrical transistor.

In a further aspect, the load includes a light emitting element.

In a further aspect, the light emitting element includes an organic light emitting diode (OLED).

In a second aspect, the present disclosure provides a method for electrical stability compensation including providing a programming phase during which a programming signal is provided to a gate of the drive transistor and a charge is released from a first variable capacitor, and providing a driving phase during which a charge is drawn from a gate of the drive transistor by the first variable capacitor.

In a further aspect, the method includes, during the programming phase, a charge is stored in a second variable capacitor and during the driving phase, a charge is injected to the gate of the drive transistor by the second variable capacitor.

In a further aspect, the load includes a light emitting element.

In a third aspect, the present disclosure provides an apparatus for electrical stability compensation including a drive transistor connecting a power supply to a load, a first variable capacitor comprising a transistor in which a source and a drain to provide a gate and a source, wherein the gate of the first variable capacitor is connected to the gate of the drive transistor and the first variable capacitor is configured to draw a charge from the gate of the drive transistor during a driving phase for the load, a second variable capacitor comprising a transistor in which a source and a drain to provide a gate and a source, wherein the gate of the second variable capacitor is connected to the gate of the drive transistor and the variable capacitor is configured to inject a charge to the gate of the drive transistor during the driving phase, and a switch transistor for controlling a connection between a programming signal source and a gate of the drive transistor.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIG. 26 illustrates a pixel circuit with a drive transistor and a second variable capacitor sharing a control signal, accordance with an embodiment;

FIG. 27 illustrates a driving scheme for the pixel circuit of FIG. 26, in accordance with an embodiment;

DETAILED DESCRIPTION

Figure 1:
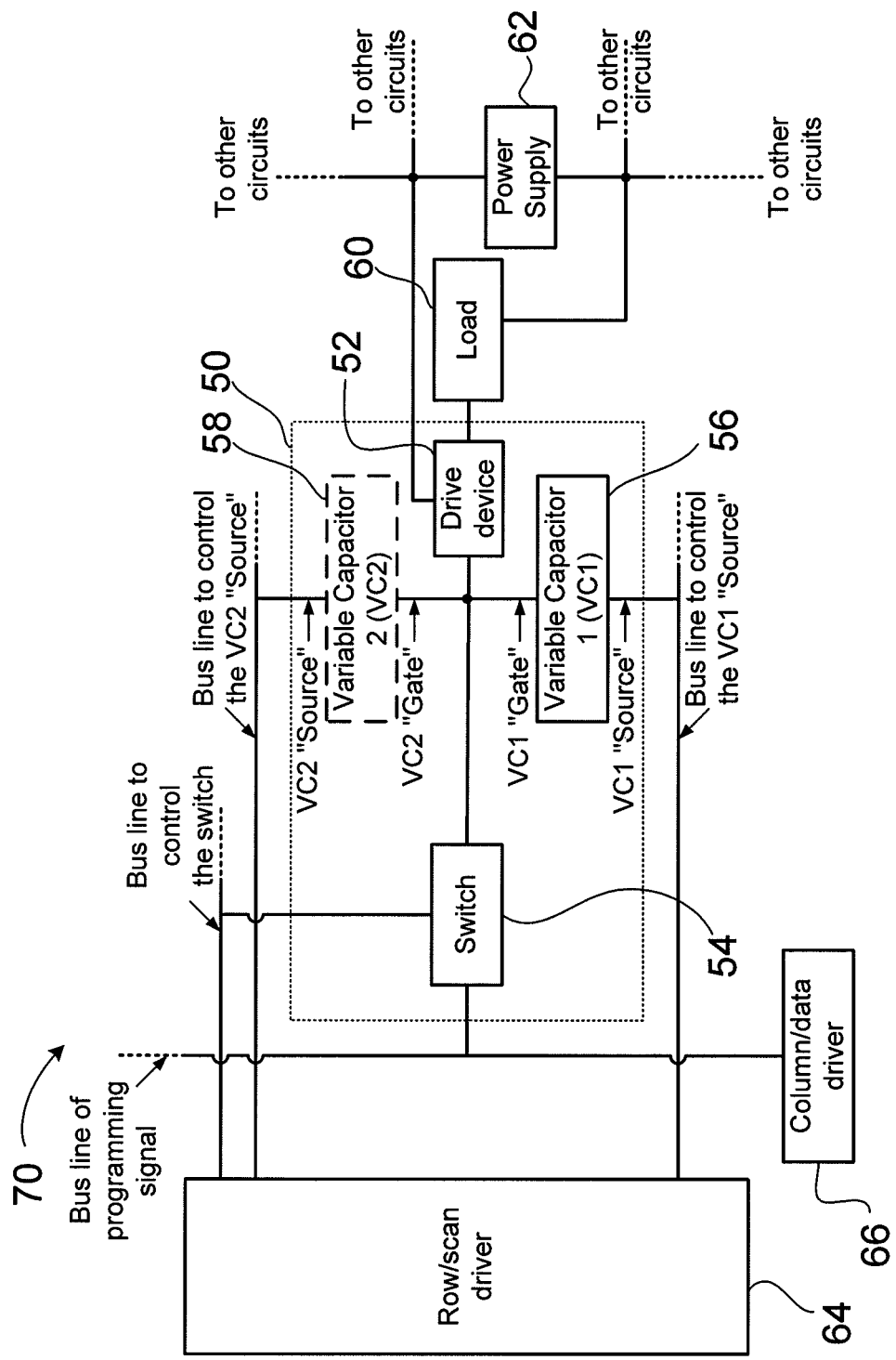
FIG. 1 is a simplified drawing of a generic schematic of an array having a electrical stability compensation apparatus, in accordance with an embodiment.

FIG. 1 illustrates a threshold electrical stability compensation apparatus or circuit 50, in accordance with an embodiment. In this embodiment, the electrical stability compensation apparatus 50 is shown in an array 70 in which common programming signals and a common power supply may be used among a plurality of electrical stability compensation apparatuses 50. The array 70 may represent a pixel array in a light-emitting display and the electrical stability compensation apparatus 50 may represent a pixel element. It will be understood that the electrical stability compensation apparatus 50 may also be generalized to other applications where compensation for electrical instability may be useful.

For example, the electrical stability compensation apparatus may be used with inorganic LEDs of a wide band gap semiconductor material for ultraviolet (UV) light disinfectants for water purification. In the UV water purification example, the apparatus is intended to provide an optimal brightness for efficient antibacterial water sanitation.

In a further example, the electrical stability compensation apparatus may be used in a piezoelectric device such as a membrane actuator for providing vibrational motion. In the piezoelectric device, the apparatus is intended to provide consistent amplitude generation of acoustic wave propagating devices such as micro-electro-mechanical systems (MEMS).

In FIG. 1, the array 70 includes a load 60 (e.g., a light-emitting device, such as an OLED). The apparatus 50 includes a drive device 52 (e.g., a transistor, such as a TFT) to control a drive signal (e.g., drive current) from a power supply 62. The drive device 52 controls a characteristic (e.g., luminance) generated by the load 60. The apparatus 50 also includes a switch 54, a first variable capacitor 56 (VC1), and an optional second variable capacitor 58 (VC2). A gate of the first variable capacitor 56 is connected to a gate of the drive device 52. A gate of the second variable capacitor 58 is connected to the gate of the drive device 52. It will be understood that, for a color display, each pixel may comprise a few sub-pixels generating different colors.

The variable capacitor 56, 58 is a component with at least two terminals, including a gate and a source (as defined herein) of the variable capacitor 56, 58. The variable capacitor 56, 58 has a threshold voltage ($V_T$) and a gate-to-source voltage ($V_{gs}$). The $V_{gs}$ of the variable capacitor 56, 58 is a voltage difference between the gate and source of the variable capacitor 56, 58. Which terminal is the gate of the variable capacitor 56, 58 and which terminal is the source of the variable capacitor 56, 58 is defined such that the definition of the $V_{gs}$ of the variable capacitor 56, 58 is in accordance to the following descriptions of the dependence of the capacitance of the variable capacitor 56, 58 on the $V_{gs}$ of the variable capacitor 56, 58. The capacitance of the variable capacitor 56, 58 may be dependent on the $V_{gs}$ of the variable capacitor 56, 58. For example, the capacitance of the variable capacitor 56, 58 when $V_{gs}$ is in a range whose lower boundary is higher than or equal to $V_T$ may be larger than the one when $V_{gs}$ is in a range whose upper boundary is lower than or equal to $V_T$. When $V_{gs} > V_T$, the variable capacitor 56, 58 may be indicated as ON. When $V_{gs} < V_T$, a variable capacitor 56, 58 may be indicated as OFF. A charge stored in the variable capacitor 56, 58 may vary with the change of the characteristics (e.g. capacitance, $V_T$, etc.) of the variable capacitor 56, 58.

The array 70 includes row scan driver 64 and column data driver 66, which control the switch 54, and variable capacitors 56, 58. The electrical stability compensation apparatuses 50 in the same row may be controlled by the same row driver 64, and the electrical stability compensation apparatuses 50 in the same column may be controlled by the same column driver 66. There are a few ways to drive the array 70. For example, electrical stability compensation apparatuses 50 may be programmed row-by-row: first, the electrical stability compensation apparatuses 50 in a row are configured into a programming phase by the corresponding row driver 64; then, they are programmed respectively by the signals provided by the corresponding column drivers 66. After the programming of one row of electrical stability compensation apparatuses 50 is completed, the corresponding row driver 64 configures the electrical stability compensation apparatuses 50 in the row into a driving phase to let the electrical stability compensation apparatuses 50 generate their respective drive signals (e.g., drive currents) to control the loads 60 to generate their respective characteristics (e.g., luminance) as programmed in the programming phase. In the meantime, the electrical stability compensation apparatuses 50 in the next row are configured into the programming phase by the row driver 64 of the next row, and same cycle repeats.

In the array 70, bus lines of the switch 54 and the first and second variable capacitors 56, 58, respectively, can be shared by electrical stability compensation apparatuses 50 in the same row and connected to the row driver(s) 64. Bus lines of the programming signals can be shared by the electrical stability compensation apparatuses 50 in the same columns and connected to the column driver(s) 66. The power supply 62 and ground connections may be shared by all electrical stability compensation apparatuses 50 in the array 70.

Figures 2, 3:
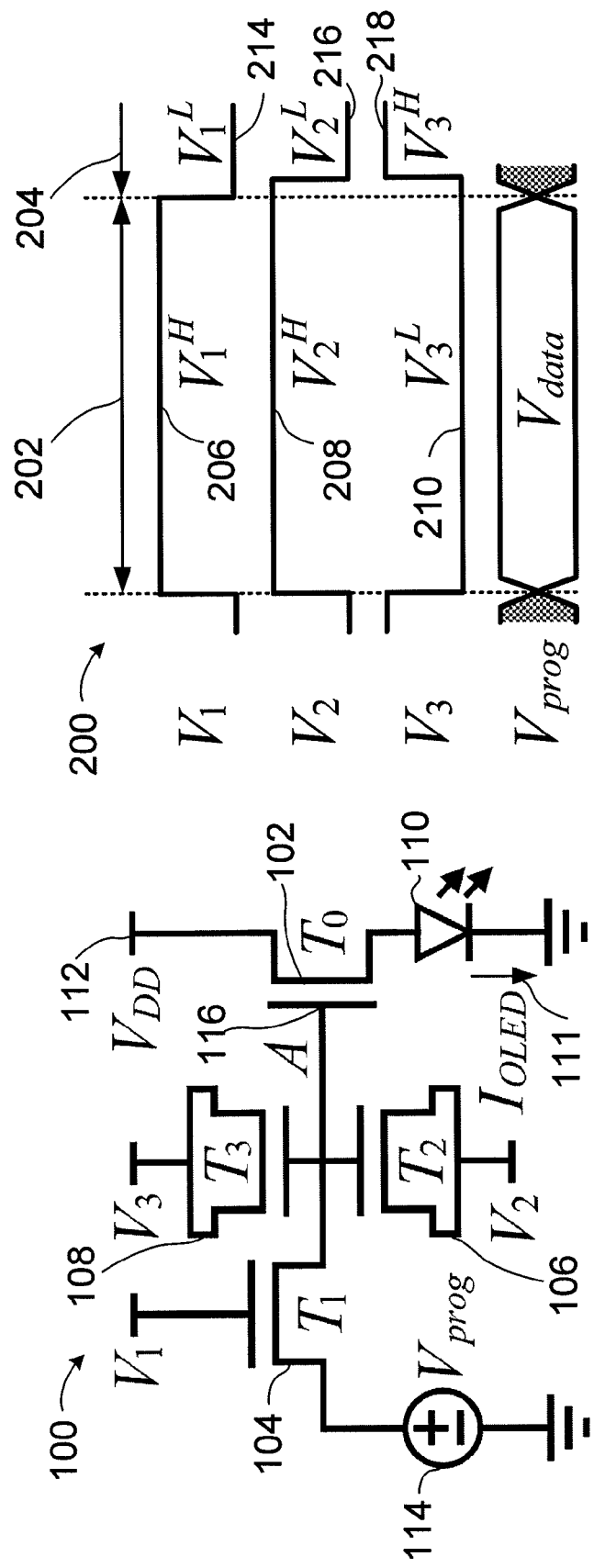
FIG. 2 illustrates a pixel circuit, in accordance with an embodiment.
FIG. 3 illustrates a driving scheme for electrical stability compensation, in accordance with an embodiment.

FIG. 2 illustrates a threshold electrical stability compensation apparatus or circuit 100, in accordance with an embodiment. In this example, the circuit 100 is a pixel circuit for use with a display. The pixel circuit 100 includes a drive transistor 102 ($T_0$), a switch transistor 104 ($T_1$), a first variable capacitor 106 ($T_2$), a second, optional, variable capacitor 108 ($T_3$), and a load 110 such as a light emitter, for example, an OLED. The transistors 102, 104 may be implemented by using different types of transistors, for example, n-type or p-type thin-film transistors (TFTs).

One of, or both of the variable capacitors 106, 108 may be TFT-based metal-insulator-semiconductor (MIS) capacitors constructed by connecting a source and a drain of n-type or p-type TFTs, respectively. An n-type TFT with its source and drain being connected together is an example of a variable capacitor. In this case, the gate terminal of the variable capacitor 106, 108 can be defined as the gate of the TFT; the source terminal of the variable capacitor 106, 108 can be defined as the source of the TFT, which is connected to the drain of the TFT.

As a particular example, when the gate-to-source voltage of the n-type TFT is higher enough than its threshold voltage, the total capacitance of the n-type TFT is equal to the channel capacitance plus the sum of the source and drain overlap capacitances. When the gate-to-source voltage of the n-type TFT is lower enough than its threshold voltage, the total capacitance of the n-type TFT is equal to the sum of its source and drain overlap capacitances. When the gate-to-source voltage of the n-type TFT is higher than its threshold voltage, the amount of the charge stored in the n-type TFT decreases with the increase of its $V_T$.

The drive transistor 102 is configured to control the load current 111 in a driving phase ($I_{OLED}^{driv}$) from a power supply 112 ($V_{DD}$) to the load 110. The switch transistor 104 is configured to control the access from an external programming voltage driver 114 ($V_{prog}$), which may be included in a column data driver (e.g., the column data driver 66 of FIG. 1), to a node A 116 in the pixel circuit 100. The external programming voltage driver 114 provides a programming signal to the node A 116 via the switch transistor 104.

In the programming phase, the first variable capacitor 106 releases a charge, and the second variable capacitor 108 stores a charge. In the driving phase, the first variable capacitor 106 is configured to generate the compensation voltage to compensate for the $\Delta V_T$ of the drive transistor 102 so as to stabilize the drain-to-source current 111. The first variable capacitor 106 provides compensation for the $\Delta V_T$ of the drive transistor 102 by drawing charge from node A 116. The second variable capacitor 108 is configured to inject charge onto node A 116 and the gate of the drive transistor 102 to improve the load current (or drain-to-source current of the drive transistor) 111.

The gate voltage stress applied on the drive transistor 102 results in the $\Delta V_T$ of the drive transistor 102. If the $\Delta V_T$ of the drive transistor 102 is not compensated, it causes the change of the drain-to-source current 111.

Since the gate of the first variable capacitor 106 and the gate of drive transistor 102 are stressed by the same voltage (i.e., the voltage on node A 116), the $\Delta V_T$ of the first variable capacitor 106 tracks the $\Delta V_T$ of the drive transistor 102. The $\Delta V_T$ of the first variable capacitor 106 results in the change of the charge drawn by the first variable capacitor 106 from the gate of the drive transistor 102 in the driving phase, and therefore results in the change of the gate voltage of the drive transistor 102 with the $\Delta V_T$ of the drive transistor 102. Since the $\Delta V_T$ of the first variable capacitor 106 tracks the $\Delta V_T$ of the drive transistor 102, in the driving phase, the change of the gate voltage of the drive transistor 102 compensates the $\Delta V_T$ of the drive transistor 102. $\Delta V_T$ of the drive transistor 102 is compensated such that the drain-to-source current 111 does not change with the $\Delta V_T$ of the drive transistor 102. The stability of the drain-to-source current 111 in the driving phase is improved by using the first variable capacitor 106 to generate the compensation voltage so as to compensate for threshold voltage shift of drive transistor 102.

Optionally, the second variable capacitor 108 may be provided to inject charge onto the gate of the drive transistor 102 to improve the drain-to-source current 111. The second variable capacitor 108 may be needed to improve the drain-to-source current 111 to the levels that may be desirable in some practical designs.

Where the second variable capacitor 108 is not provided, the pixel circuit 100 can generally compensate the $\Delta V_T$ of the drive transistor 102. However, in this case, the drain-to-source current 111 may be relatively lower, which may be a drawback if higher current levels are desired. On the other hand, because the footprint needed for the second variable capacitor 108 is saved, it may be possible to enlarge the area of the light-emitting device and the aperture ratio of display can be improved, which may be an advantage if higher aperture ratio is desired.

Figure 4:
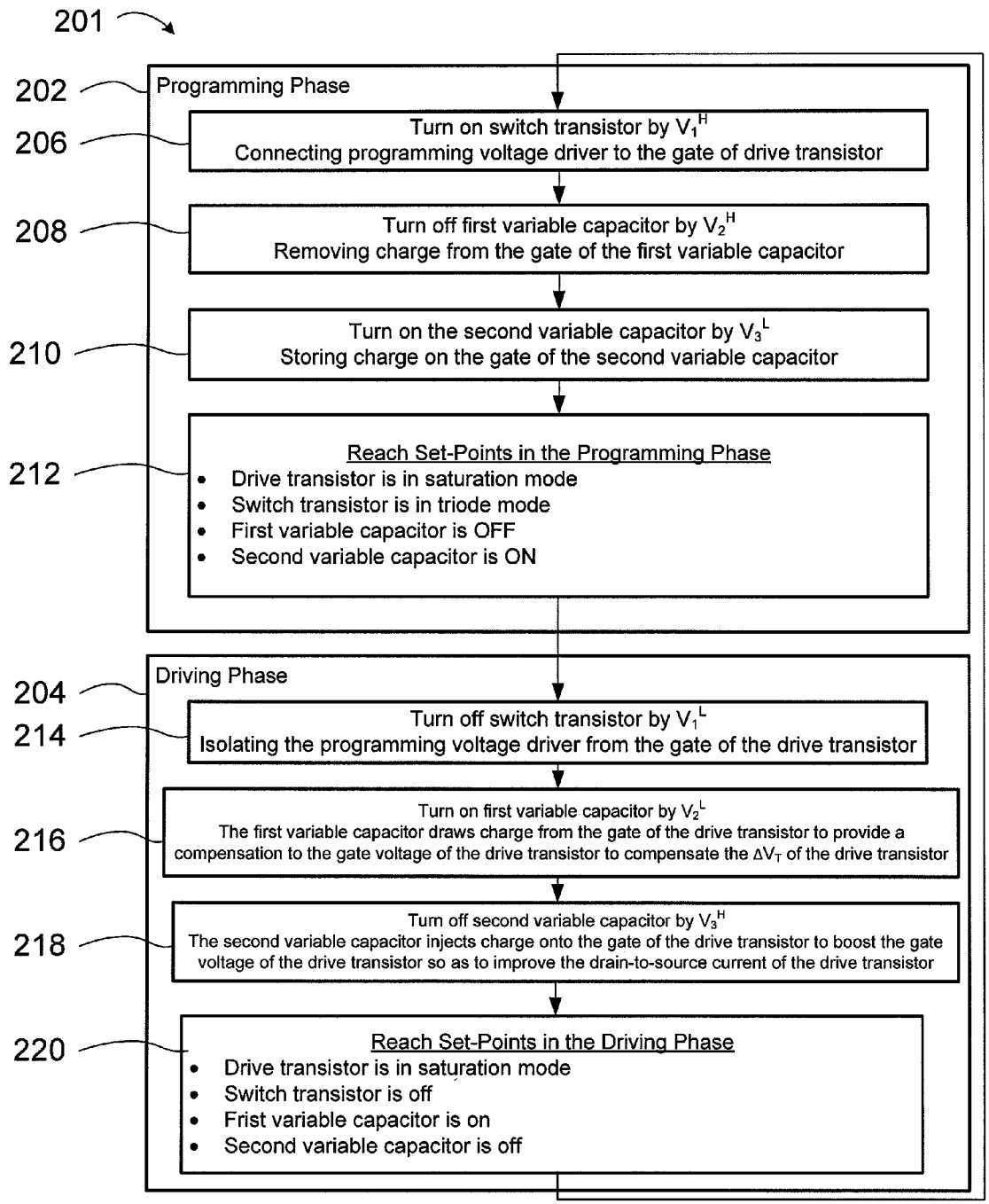
FIG. 4 illustrates a method, of electrical stability compensation, in accordance with an embodiment.

FIGS. 3 and 4 illustrate a driving scheme 200 and a method 201, respectively, for electrical stability compensation in accordance with an embodiment herein. The driving scheme 200 and method 201 illustrated each include one frame cycle and each frame cycle may include a programming phase 202 and a driving phase 204. The driving phase 204 is typically much longer in duration than the programming phase 202. It will be understood that the driving scheme 200 and method 201 may also have other phases, for example, an idle phase and/or an intermediate phase.

When the programming phase 202 begins, the switch transistor 104 is turned on, at 206, by a voltage $V_1^H$, connecting node A 116 to the programming voltage driver 114. The first variable capacitor 106 is turned OFF, at 208, by a voltage $V_2^H$ such that a charge is released from the first variable capacitor 106. The second variable capacitor 108 is turned ON, at 210, by a voltage $V_3^L$ and thus stores a charge on its gate.

A gate charge of a transistor may be divided into a gate charge due to the gate-to-channel capacitance ($Q_{ch}$) and a total gate charge due to the overlap capacitance between gate and source/drain ($Q_{ov}$). After voltages and/or currents reach the program set-points, at 212, the drive transistor 102 is in the saturation mode, the first variable capacitor 106 is OFF, the switch transistor 104 is in the triode mode, and the second variable capacitor 108 is ON. The gate-to-channel capacitance of the drive transistor 102 can be expressed as Equation 1 where $C_i$ is the channel capacitance per unit area, $W_0$, $L_0$, and $V_{T,0}$ are the width, length, and threshold voltage of the drive transistor 102, $V_{OLED}^{prog}$ is the set-point load voltage (for example, OLED voltage), and $V_{data}$ is the data voltage provided by $V_{prog}$. For the same expected $I_{OLED}^{driv}$, $V_{data}$ is provided with the same corresponding value, not changing with $V_{T,0}$. The coefficient ⅔ is used in Equation 1, as a typical assumed theoretical value, because the drive transistor 102 is biased in saturation mode. The actual value of the coefficient may depend on the specific process technology and properties of the transistor.

$$Q_{ch,0}^{prog} \approx \tfrac{2}{3} C_i W_0 L_0 (V_{data} - V_{OLED}^{prog} - V_{T,0}) \qquad \text{Eq. 1}$$

In the programming phase 202, the first variable capacitor 106 is OFF, so its $Q_{ch}$ is zero. $V_1^H$, $V_2^H$, $V_3^L$ $V_{data}$, and $V_{DD}$ do not change with $\Delta V_{T,0}$. $\Delta V_{T,1}$ and $\Delta V_{T,3}$ are negligible when compared to $\Delta V_{T,0}$ (see Equation 19 and 20 below). The $\Delta V_{OLED}^{prog}$ caused by $\Delta V_{T,0}$ is negligible (see Equation 17 below). Therefore, in the programming phase 202, the $Q_{ch}$ of the switch transistor 104 and the second variable capacitor 108 (i.e., $Q_{ch,1}^{prog}$ and $Q_{ch,3}^{prog}$) as well as the $Q_{ov}$ of all TFTs 102, 104, 106, 108 do not change with $\Delta V_{T,0}$, so they are not included in the analysis of the changes of the charge components with $\Delta V_{T,0}$.

In the driving phase 204, the switch transistor 104 is turned off, at 214, by voltage $V_1^L$, isolating the node A 116 from the programming voltage driver 114. The first variable capacitor 106 is turned ON, at 216, by voltage $V_2^L$, providing $\Delta V_{T,0}$-compensation. The second variable capacitor 108 is turned OFF, at 218, by voltage $V_3^H$, injecting a charge to node A 116 to boost the gate voltage of the drive transistor 102 so as to improve the load drive current 111. To conserve the charge on node A 116, the switch transistor 104 is turned OFF before switching $V_2$ and $V_3$.

While the switch transistor 104 is being turned off, a part of the switch transistor's channel electrons are injected to node A 116: $Q^{T1 \to A}_{Inj} \approx -\beta Q_{ch,1}^{prog}$. $\beta$ is close to ½ if $V_1$ has a high falling rate. Since $Q_{ch,1}^{prog}$ does not change with $\Delta V_{T,0}$, $Q^{T1 \to A}_{Inj}$ is not included in the analysis of the changes of the charge components with $\Delta V_{T,0}$. After node voltages settle down, at 220, the drive transistor 102 is in the saturation mode, the first variable capacitor 106 is ON, and the switch transistor 104 and the second variable capacitor 108 are OFF. The $Q_{ch}$ values of the drive transistor 102 and the first variable capacitor 106 can be expressed as by Equations 2 and 3 where $V_{G,0}^{driv}$ is the set-point voltage on node A 116, and $V_{OLED}^{driv}$ is the set-point voltage across the load 110 (for example, an OLED). Since the switch transistor 104 and the second variable capacitor 108 are OFF, their $Q_{ch}$ values are zero.

$$Q_{ch,0}^{driv} \approx \tfrac{2}{3} C_i W_0 L_0 (V_{G,0}^{driv} - V_{OLED}^{driv} - V_{T,0})$$

$$Q_{ch,2}^{driv} = C_i W_2 L_2 (V_{G,0}^{driv} - V_2^L - V_{T,2}), \quad \text{Eq. 2, 3}$$

The $Q_{ov}$ values of the transistors 102, 104, 106, 108 are given by Equations 4 to 7 where $C_{ov}$ is the unit-area source/drain overlap capacitance, $L_{ov}$ is the overlap length between the gate and source/drain, and $Q_{ov \to A,1}^{driv}$ is the gate charge of the switch transistor 104 due to the overlap capacitance on the side of node A 116.

$$Q_{ov,0}^{driv} \approx C_{ov} W_0 L_{ov} (2 V_{G,0}^{driv} - V_{OLED}^{driv} - V_{DD}),$$

$$Q_{ov \to A,1}^{driv} = -C_{ov} W_1 L_{ov} (V_{G,0}^{driv} - V_1^L),$$

$$Q_{ov,2}^{driv} = 2 C_{ov} W_2 L_{ov} (V_{G,0}^{driv} - V_2^L),$$

$$Q_{ov,3}^{driv} = 2 C_{ov} W_3 L_{ov} (V_{G,0}^{driv} - V_3^H), \quad \text{Eq. 4, 5, 6, 7}$$

Where the pixel circuit 100 is switched from the programming phase 202 to the driving phase 204, Equation 8 can be derived based on the charge conservation on node A 116. $Q_{ov,Tot}^{driv}$ can be expressed as Equation 9. Although other charge components may also contribute to the charge conservation on node A 116, they may not vary with $\Delta V_{T,0}$ and thus are not included in Equation 8.

$$\frac{dQ_{ch,0}^{prog}}{dV_{T,0}} = \frac{dQ_{ch,0}^{driv}}{dV_{T,0}} + \frac{dQ_{ch,2}^{driv}}{dV_{T,0}} + \frac{dQ_{ov,Tot}^{driv}}{dV_{T,0}}, \quad \text{Eq. 8}$$

$$Q_{ov,Tot}^{driv} = Q_{ov,0}^{driv} - Q_{ov \to A,1}^{driv} + Q_{ov,2}^{driv} + Q_{ov,3}^{driv} \quad \text{Eq. 9}$$

The current $I_{DS}$ of the drive transistor 102 when it operates in saturation mode can be expressed by Equation 10 where $\alpha_{SAT}$, $\mu_n$, $\gamma$, and $V_{AA}$ are device parameters.

$$\alpha_{SAT} \mu_n C_i \frac{W}{L} \frac{(V_{GS} - V_T)^{\gamma+2}}{V_{AA}^\gamma}, \quad \text{Eq. 10}$$

Therefore, when $V_{T,0}$ shifts, the condition required to stabilize $I_{OLED}^{driv}$ can be expressed as Equation 11.

$$dV_{GS,0}^{driv}/dV_{T,0} = 1 \quad \text{Eq. 11}$$

Since $V_{S,0} = V_{OLED}$ and $dV_{OLED}^{driv}/dV_{T,0} = 0$ (see Equation 18, below), Equation 11 is equivalent to Equation 12.

$$dV_{G,0}^{driv}/dV_{T,0} = 1 \quad \text{Eq. 12}$$

When $\Delta V_{T,0}$ is fully compensated by $\Delta V_{GS,0}^{driv} = \Delta V_{T,0}$, the channel charge of the drive transistor 102 in the driving phase 204 does not change with $\Delta V_{T,0}$ which is described by Equation 13.

$$dQ_{ch,0}^{driv}/dV_{T,0} = 0 \quad \text{Eq. 13}$$

Substituting Equation 13 into Equation 8 yields Equation 14.

$$\frac{dQ_{ch,0}^{prog}}{dV_{T,0}} = \frac{dQ_{ch,2}^{driv}}{dV_{T,0}} + \frac{dQ_{ov,Tot}^{driv}}{dV_{T,0}} \quad \text{Eq. 14}$$

Substituting Equations 1-7, and 9 into Equation 14 and then using the relevant formulas presented below yields Equation 15, which gives the parameters that specify the width of the first variable capacitor 106, where $C_{ov,n} = C_{ov} W_n L_{ov}$ (n=0, 1, 2, 3).

$$W_2 = \frac{2/3 C_i W_0 L_0 + 2 C_{ov,0} + C_{ov,1} + 2 C_{ov,3}}{1/2 C_i L_2 - 2 C_{ov} L_{ov}} \quad \text{Eq. 15}$$

The $\Delta V_{T,0}$-compensation can be achieved by sizing the first variable capacitor 106 as specified in Equation 15. For the variable capacitors 106, 108 fabricated by using different process technologies or facilities, and/or designed to have different properties (for example, different geometries, structures, shapes, features, etc.), the coefficient values (e.g. ⅔) may be adjusted according to the procedure as outlined above. The coefficient values (e.g., ⅔, ½, 2, etc.) used in the above procedures may be process/technology-dependent and/or design-dependent. Although the coefficient value may be adjusted in a specific design, the procedures as outlined above may still be valid for circuit analysis and design.

$\Delta V_{T,0}$-compensation mechanism is explained by analyzing Equation 8, where $V_{T,0}$ shifts but the change in $V_{T,0}$ is compensated. $Q_{ch,0}^{prog}$ reduces when $V_{T,0}$ increases (i.e., the increase of $V_{T,0}$ results in less channel charge stored in the drive transistor 102 in the programming phase 202).

To compensate for $\Delta V_{T,0}$, $\Delta V_{G,0}^{driv}$ should be as large as $\Delta V_{T,0}$. Since $Q_{ov,Tot}^{driv}$ increases with $V_{G,0}^{driv}$, more charge may be needed to be provided to the gate-to-source/drain overlap capacitors which belong to transistors 102, 104, 106, 108 and connect to the node A, otherwise $V_{G,0}^{driv}$ may not be able to increase with $V_{T,0}$. Since $V_{T,2}$ increases faster than $V_{GS,2}^{driv}$, $Q_{ch,2}^{driv}$ decreases when $V_{T,0}$ increases.

Designing $W_2$ as specified in Equation 15 validates Equation 14. This means that, when $V_{T,0}$ increases, the decrease of $Q_{ch,2}^{driv}$ is so large that it not only cancels out the decrease of $Q_{ch,0}^{prog}$ but also provides the extra charge needed by the increase of $Q_{ov,Tot}^{driv}$. As a result, $Q_{ch,0}^{driv}$ does not change with $V_{T,0}$, so $\Delta V_{GS,0}^{driv}$ is as large as $\Delta V_{T,0}$. Since $\Delta V_{T,0}$ is fully compensated by $\Delta V_{GS,0}^{driv}$, it does not affect $I_{OLED}^{driv}$.

To demonstrate the effectiveness of the pixel circuit 100, circuit simulations were carried out on the pixel circuit 100, which was driven by the drive scheme 200 and method 201. Simulations were carried out using a Cadence Spectre circuit simulator and a-Si:H TFT model where $\mu_{eff} = 0.3 \text{ cm}^2/V_s$, $V_T^{Init} = 3V$, $C_i = 19 \text{ nF/cm}^2$, and $C_{ov} = 16 \text{ nF/cm}^2$, and the OLED model fitted to the measured data of OLED I-V characteristics. $\mu_{eff}$ is the transistor effective mobility, and $V_T^{Init}$ is the $V_T$ for a fresh transistor before being electrically stressed.

TABLE I

| Parameter | Value | Parameter | Value |
|---|---|---|---|
| Programming Phase (μs) | 120 | $V_{data}$ (V) | 10~25 |
| $W_0/L_0$ (μm) | 100/25 | $V_{DD}$ (V) | 30 |
| $W_1/L_1$ (μm) | 50/25 | $V_1$ (V) | 0~30 |
| $W_2/L_2$ (μm) | 60/100 | $V_2$ (V) | 2~30 |

TABLE I-continued

| Parameter | Value | Parameter | Value |
|---|---|---|---|
| $W_3/L_3$ (μm) | 35/100 | $V_3$ (V) | 2~30 |
| $L_{ov}$ (μm) | 5 | $I_{OLED}^{driv}$ (μA) | 0~3 |

The parameter values of the simulated pixel circuit 100 are listed in Table I. The parameter values listed are exemplary values used in the simulation. It will be understood that other parameter values may be used. The minimum channel length was selected as 25 μm. Values as small as 0.5 μm to 1 mm may be used as minimum channel length. The minimum channel length of the transistors 102, 104, 106, 108 may be selected as needed in a specific design. Based on the simulation results, $W_2$=60 μm was determined as a preferred value for $\Delta V_{T,0}$-compensation in the simulated example of the pixel circuit 100. Values for $W_2$ may range from 0.5 μm to 1 mm. Transistors 102, 104 and/or variable capacitors 106, 108 may be scaled up or down to any desirable level, and the scaling may not affect $\Delta V_{T,0}$-compensation. Where the transistors 102, 104 and/or the variable capacitors 106, 108 are scaled down, their footprint may be reduced, such that the performance of the pixel/display may be improved, for example improved response speed, refresh rate, resolution, power consumption, display panel size, aperture ratio etc.

To verify the $\Delta V_{T,0}$-compensation, $\Delta V_{T,0}$ was varied in simulations, and $\Delta V_{T,2}$ was set as $\Delta V_{T,2}$=3/2$\Delta V_{T,0}$. The degradations of the switch transistor 104, the second variable capacitor 108 and load 110 were neglected.

Figure 5:
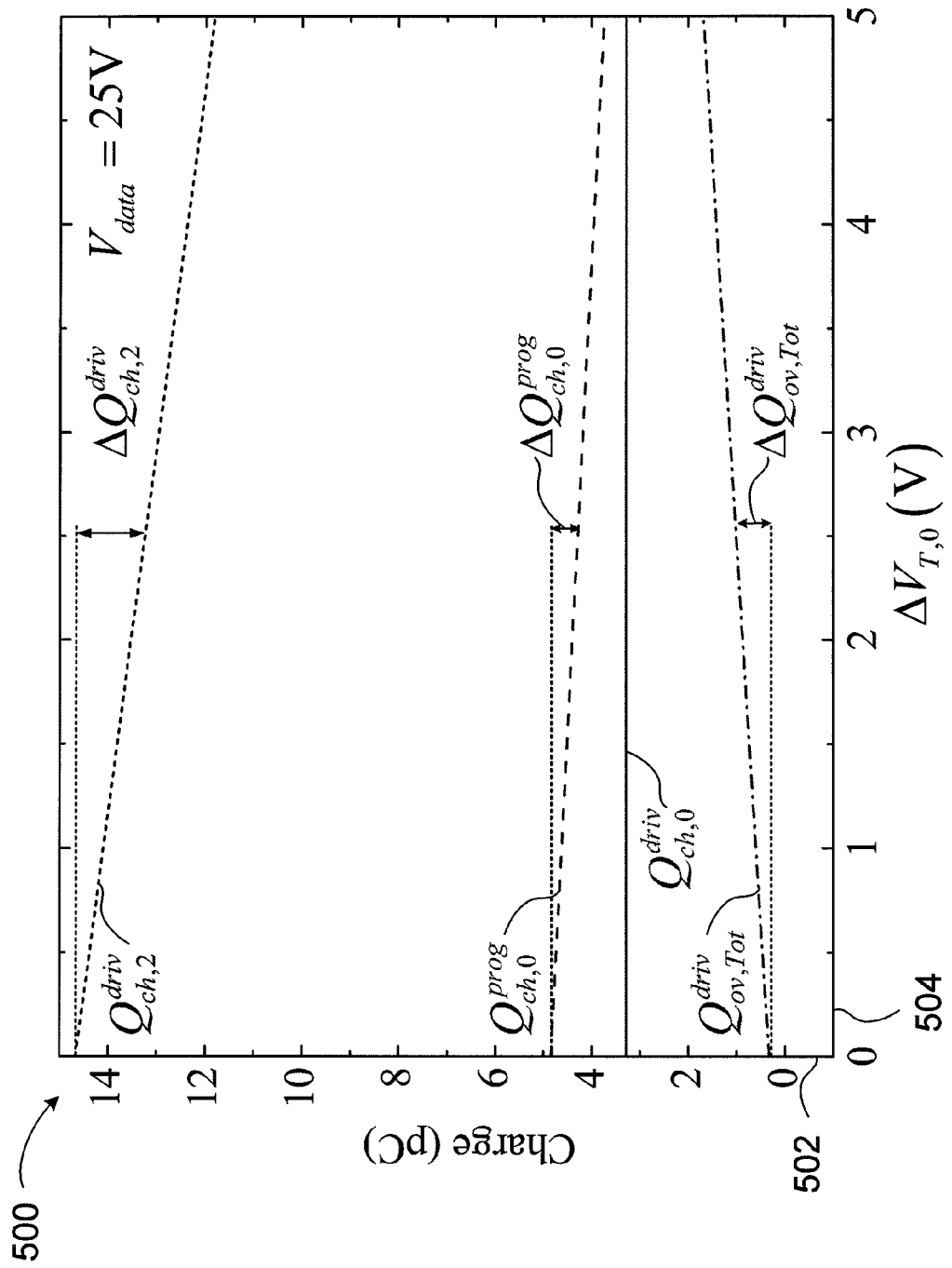
FIGS. 5 and 6 are graphs of simulation results of the pixel circuit of FIG. 2 showing charge components versus $\Delta V_{T,0}$ for the brightness data voltage programmed into the circuit by the data driver equals 25V and 10V, respectively.
Figure 6:
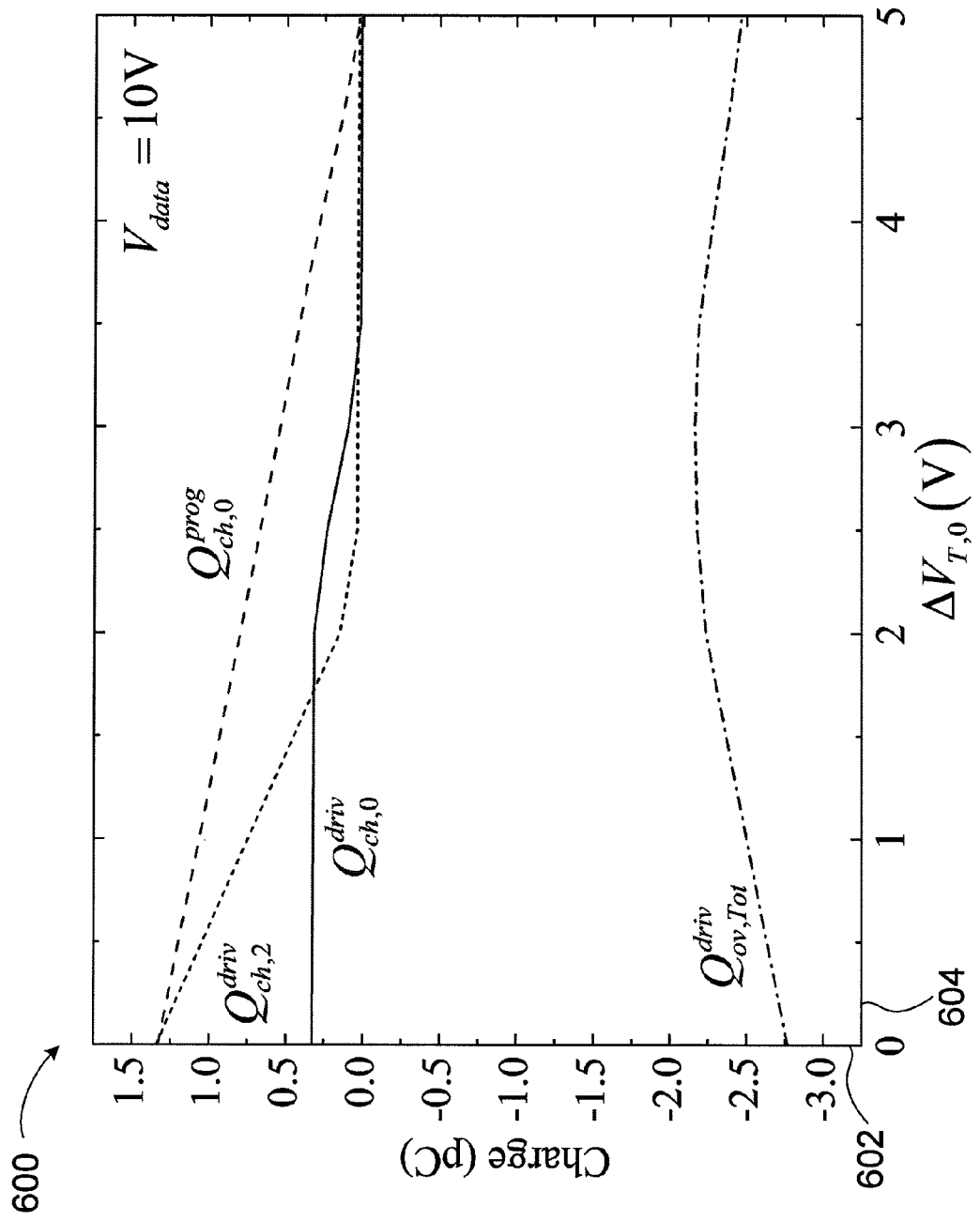

FIGS. 5 and 6 are graphs 500, 600, respectively, of simulation results of the pixel circuit 100 showing charge components 502, 602 versus $\Delta V_{T,0}$ 504, 604 (in Equation 8) for $V_{data}$=25V and 10V, respectively. When $\Delta V_{T,0}$ 504 increases, $\Delta Q_{ch,2}^{driv}$ is so large that it equals $\Delta Q_{ch,0}^{prog}-Q_{ov,Tot}^{driv}$, so $Q_{ch,0}^{driv}$ does not change with $\Delta V_{T,0}$ 504. FIG. 6 illustrates, for $V_{data}$=10V, that $\Delta V_{T,0}$ 604 is not always fully compensated. For $\Delta V_{T,0}$>2.25V, $Q_{ch,0}^{driv}$ starts to drop, indicating $\Delta V_{GS,0}^{driv}<\Delta V_{T,0}$. This is referred to as the under-compensation of $\Delta V_{T,0}$ 604.

Figure 7:
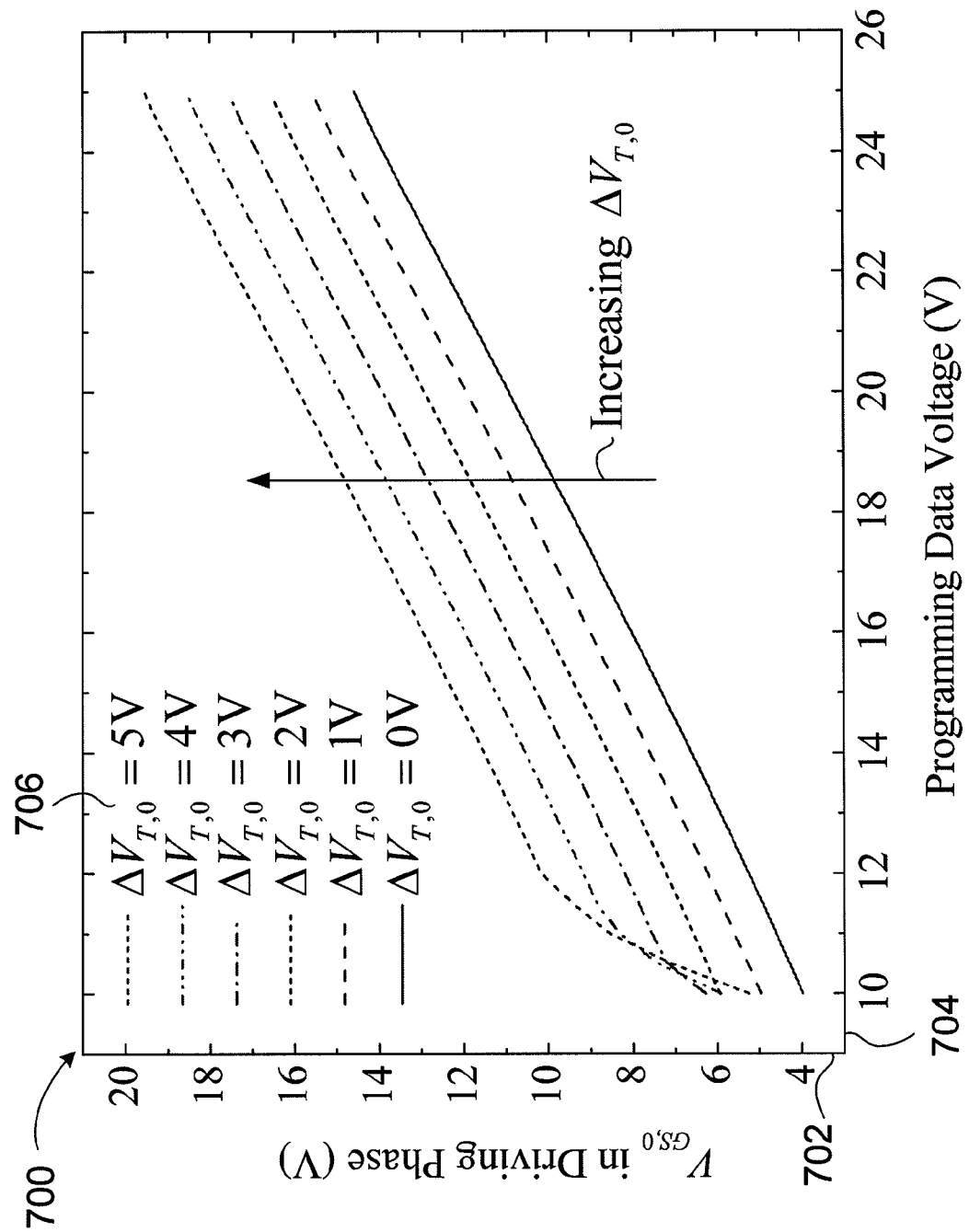
FIG. 7 is a graph of simulation results of the pixel circuit of FIG. 2 showing the incremental change of gate-to-source voltage of a drive transistor after reaching a set-point in a driving phase ($\Delta V_{GS,0}^{driv}$) versus $V_{data}$ for different $\Delta V_{T,0}$.
Figure 8:
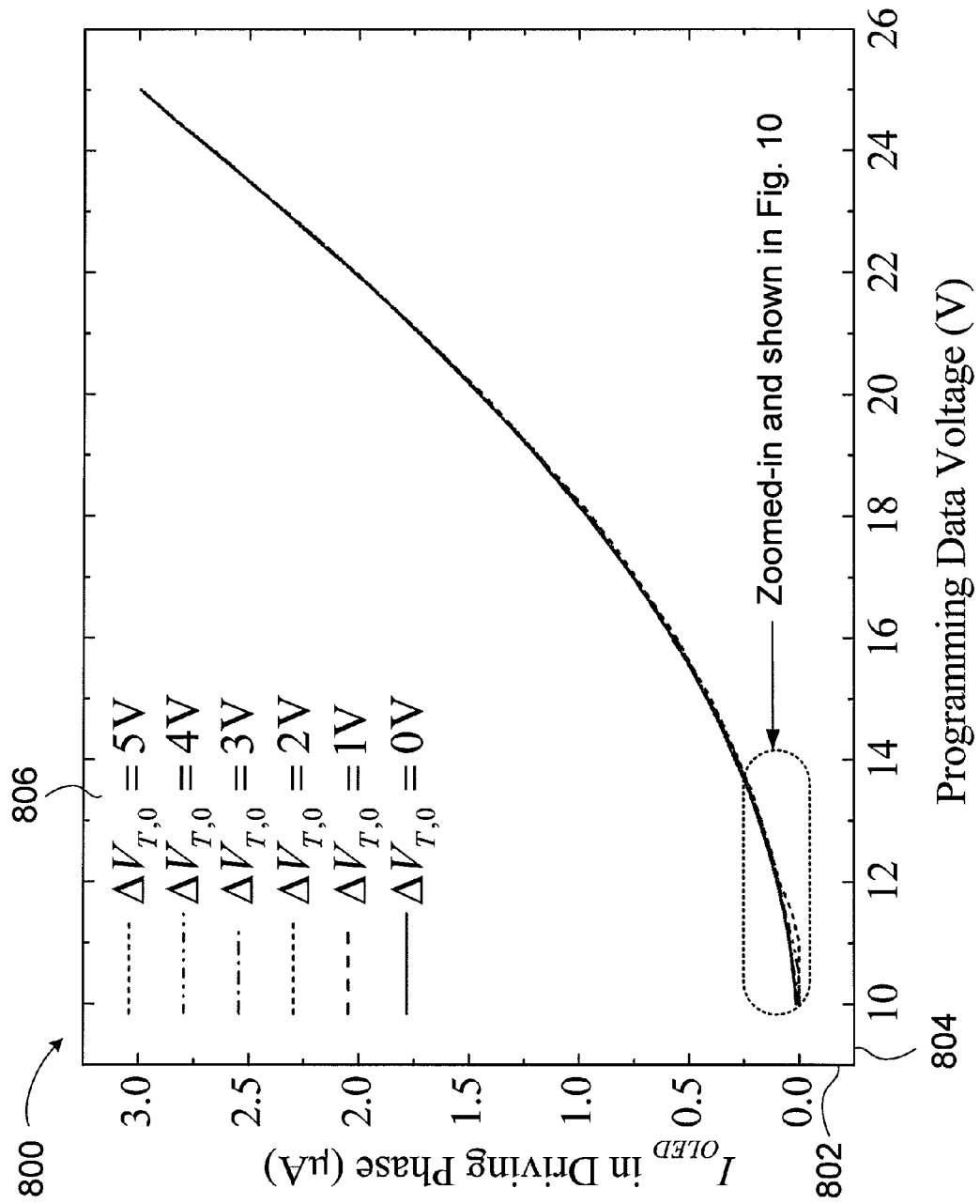
FIG. 8 is a graph of simulation results of the pixel circuit of FIG. 2 showing OLED current after it reaches the set-point in the driving phase ($I_{OLED}^{driv}$) versus $V_{data}$ for different $\Delta V_{T,0}$.

FIG. 7 is a graph 700 showing $\Delta V_{GS,0}^{driv}$ 702 versus $V_{data}$ 704 for different $\Delta V_{T,0}$ 706 of the simulated pixel circuit 100. FIG. 8 is a graph 800 of simulation results of the pixel circuit 100 showing $I_{OLED}^{driv}$ 802 versus $V_{data}$ 804 for different $\Delta V_T$ 806. FIG. 7 illustrates that for relatively high $V_{data}$ 704, $\Delta V_{GS,0}^{driv}=\Delta V_{T,0}$ 706, so $\Delta V_{T,0}$ 806 does not affect $I_{OLED}^{driv}$ as illustrated in FIG. 8.

Figure 9:
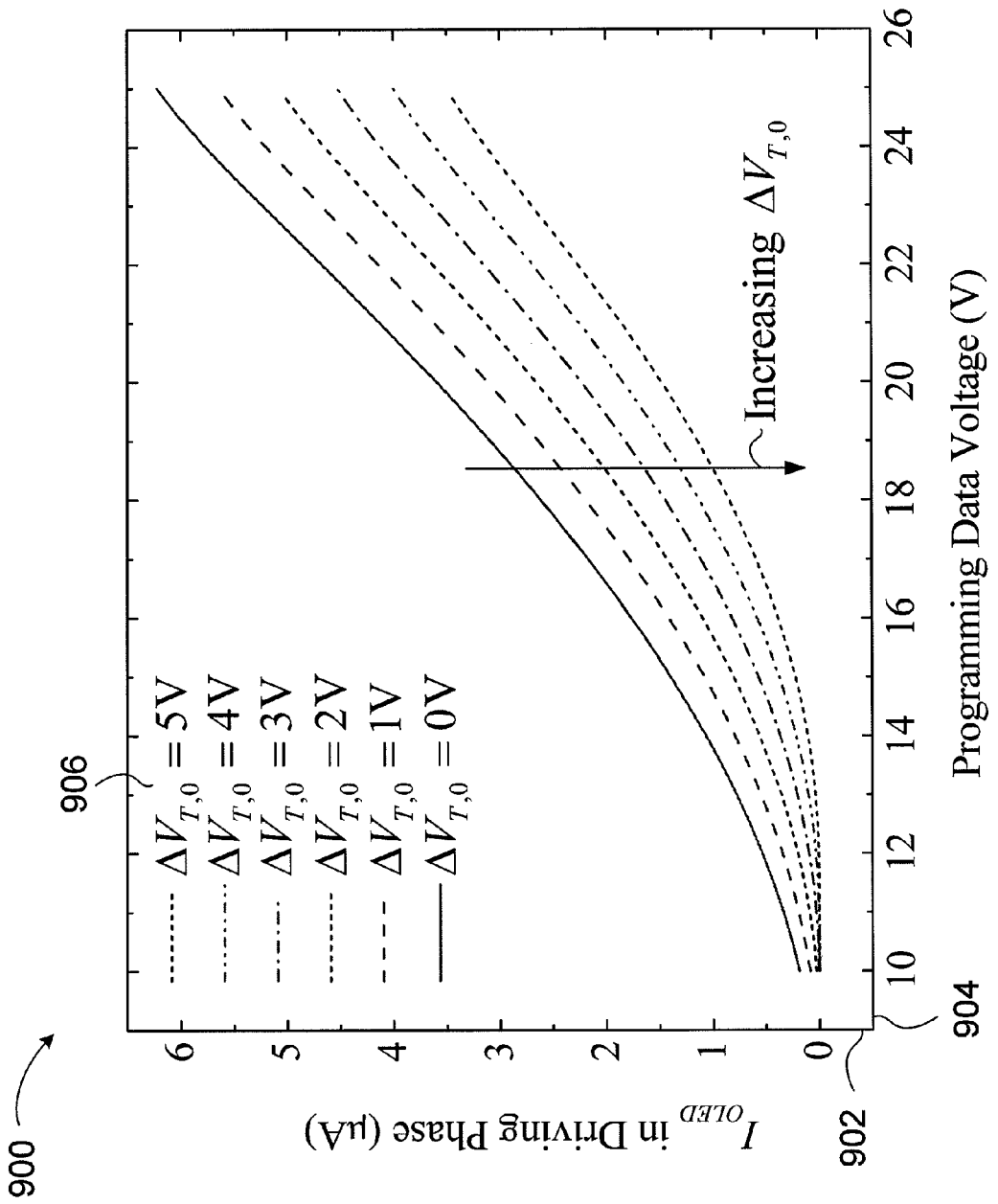
FIG. 9 is a graph of simulation results of a conventional voltage-programmed 2-transistor pixel circuit showing $I_{OLED}^{driv}$ versus $V_{data}$ for different $\Delta V_{T,0}$.

FIG. 9 is a graph 900 of simulation results of a conventional voltage programmed 2-transistor pixel circuit showing $I_{OLED}^{driv}$ 902 versus $V_{data}$ 904 for different $\Delta V_T$ 906. FIG. 9 illustrates that since there was no $\Delta V_{T,0}$-compensation, $I_{OLED}^{driv}$ 902 dropped significantly with the increase of $\Delta V_{T,0}$ 906. The comparison between FIG. 8 and FIG. 9 shows the effectiveness of the pixel circuit 100 in $\Delta V_{T,0}$-compensation as compared to a simulated conventional voltage-programmed 2-transistor pixel circuit.

Figure 10:
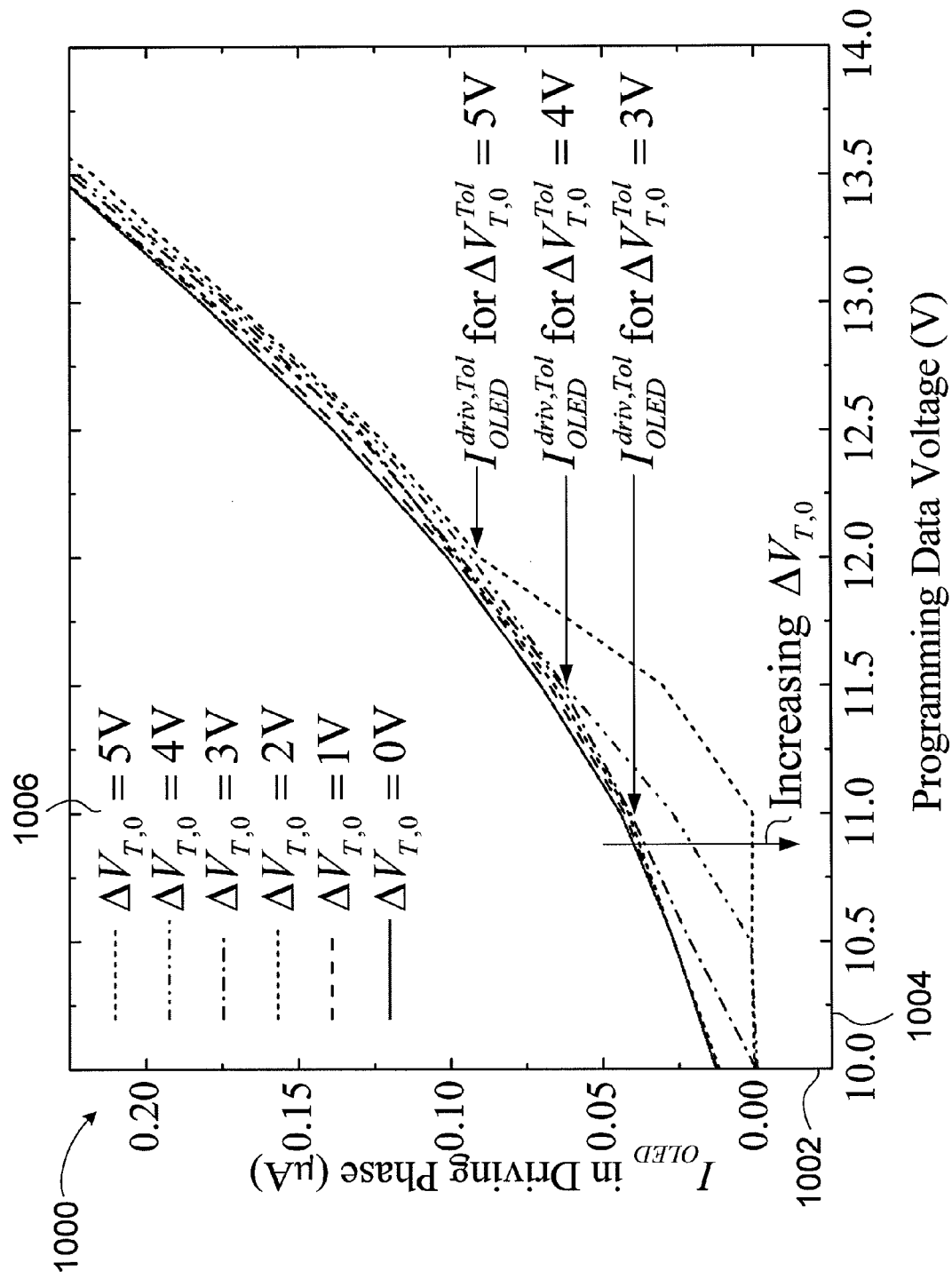
FIG. 10 is a graph of simulation results of the detail of FIG. 8 showing $I_{OLED}^{driv}$ versus $V_{data}$ for different $\Delta V_{T,0}$.

FIG. 10 is a graph 1000 of simulation results of the detail of FIG. 8 showing $I_{OLED}^{driv}$ 1002 versus $V_{data}$ 1004 for different $\Delta V_T$ 1006. For lower $V_{data}$ 1004 and $I_{OLED}^{driv}$ 1002, the under-compensation of $\Delta V_{T,0}$ 1006 appears at lower $\Delta V_{T,0}$ 1006, as shown in FIGS. 6, 7, 8, and 10. This can be explained based on Equation 22, which indicates that $V_{T,2}$ increases with $V_{T,0}$. For a smaller $V_{data}$, $V_{GS,2}^{driv}$ is also smaller, so the $\Delta V_{T,0}$ at which $V_{T,2}$ increases up to $V_{GS,2}^{driv}$ is smaller. Once $V_{T,2}$ catches up with $V_{GS,2}^{driv}$, $Q_{ch,2}^{driv}$ becomes zero and thus stops decreasing with the increase of $\Delta V_{T,0}$, so $Q_{ch,0}^{driv}$ starts to drop with the increase of $\Delta V_{T,0}$ (see, e.g., FIG. 6). This indicates that $V_{GS,2}^{driv}<\Delta V_{T,0}$ (i.e., $\Delta V_{T,0}$ is under-compensated (see, e.g., FIG. 7)). So $I_{OLED}^{driv}$ starts to drop with the increase of $\Delta V_{T,0}$ (see, e.g., FIG. 10). If $\Delta V_{T,0}$ is not too large, the under-compensation of $\Delta V_{T,0}$ exists only at the lowest $I_{OLED}^{driv}$ levels (see, e.g. FIGS. 7 and 8), so it does not affect the overall stability of $I_{OLED}^{driv}$.

While $dV_{T,2}/dV_{T,0} \approx 3/2$ was assumed, this approximation may have a discrepancy up to 10%. Discrepancy factor ($F_{dis}$) is the factor defined to describe the discrepancy of the actual value of $dV_{T,2}/dV_{T,0}$ away from 3/2, which is the assumed theoretical value of $dV_{T,2}/dV_{T,0}$. $F_{dis}$ is defined so that $dV_{T,2}/dV_{T,0}=(3/2)F_{dis}$, where $F_{dis}$ is within a range from 0.9 to 1.1. Correspondingly, Equation 15 becomes Equation 16.

$$W_2 = \frac{2/3 C_i W_0 L_0 + 2C_{ov,0} + C_{ov,1} + 2C_{ov,3}}{(3/2 F_{dis} - 1)C_i L_2 - 2C_{ov}L_{ov}}. \quad \text{Eq. 16}$$

Figure 11:
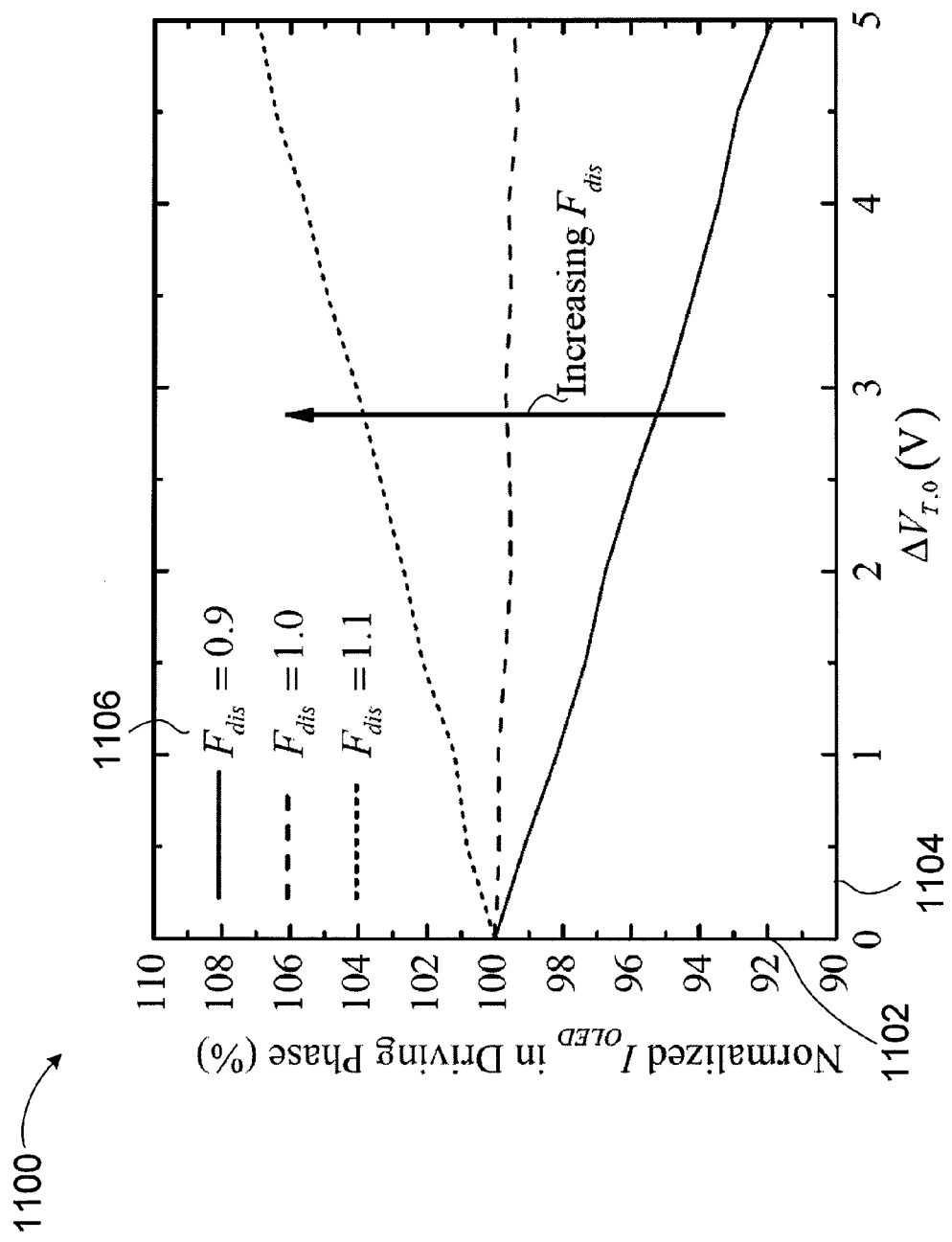
FIG. 11 is a graph of simulation results of the pixel circuit of FIG. 2 showing normalized simulation results of $I_{OLED}^{driv}$ versus $\Delta V_{T,0}$ for $V_{data}$=25V and different $F_{dis}$.

FIG. 11 is a graph 1100 of simulation results of the pixel circuit 100 showing normalized simulation results of $I_{OLED}^{driv}$ 1102 versus $\Delta V_{T,0}$ 1104 for $V_{data}$=25V. FIG. 11 illustrates the impact of the variation in $F_{dis}$ 1106 on the stability of $I_{OLED}^{driv}$ 1102 for a $W_2$ value designed by assuming $F_{dis}$=1. For $F_{dis}$>1, $\Delta V_{T,0}$ 1104 is over-compensated, so $I_{OLED}^{driv}$ 1102 increases with $\Delta V_{T,0}$ 1104. For $F_{dis}$<1, the opposite trend exists. For $F_{dis} \in (0.9, 1.1)$, the instability of $I_{OLED}^{driv}$ 1102 is within 8%. In design practice, the value of $F_{dis}$ 1106 may be extracted from measurement results and then used in Equation 16 to achieve a more accurate $\Delta V_{T,0}$-compensation.

If the second variable capacitor 108 is not used, since the first variable capacitor 106 draws charge from node A 116 after the driving phase 204 begins, $V_{G,0}^{driv}$ may be lower than what is needed by the $I_{OLED}^{driv}$ levels desired in practical designs. Therefore, the second variable capacitor 108 may be used to improve $I_{OLED}^{driv}$ levels. In the programming phase 202, the second variable capacitor 108 is turned ON at 210 by $V_3^L$ and stores charge on its gate. In the driving phase 204, $V_3$ is switched to $V_3^H$, at 218, to inject the charge from the gate of the second variable capacitor 108 onto node A 116, improving $V_{G,0}^{driv}$ and therefore $I_{OLED}^{driv}$. The improvement $I_{OLED}^{driv}$ can be adjusted by varying the size of the second variable capacitor 108.

$Q_{ch,3}^{prog}$ is the gate charge associated to the channel of the second variable capacitor 108. It is stored on the gate of the second variable capacitor 108 in the programming phase 202 and injected onto node A 116 in the driving phase 204. Since $V_3^L$ is a fixed value shared by all pixels in the same row, $Q_{ch,3}^{prog}$ is determined by the specific $V_{data}$ for the pixel. $Q_{ch,3}^{prog}$ does not change with $\Delta V_{T,0}$, so it does not affect $\Delta V_{T,0}$-compensation. The impact of the usage of the second variable capacitor 108 on $\Delta V_{T,0}$-compensation is due to $C_{ov,3}$. However, this impact is minor because $C_{ov,3}$ is a parasitic component. Assuming $C_{ov}=C_i$, using the geometries in Table I, one can see that $C_{ov,3}$ is 3.55% of the total capacitance on node A 116 in the driving phase 204.

Figure 12:
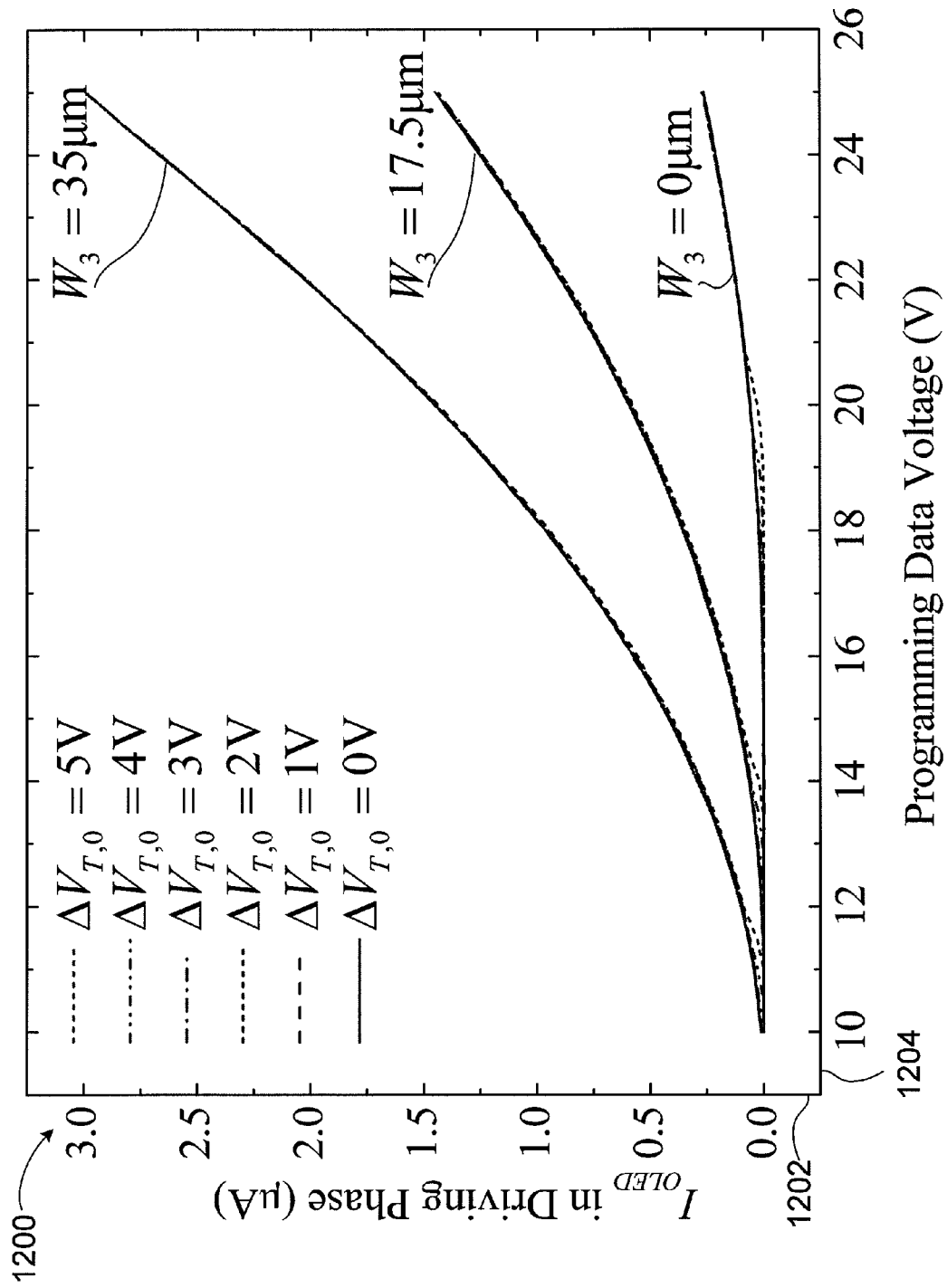
FIG. 12 is a graph of simulation results of the pixel circuit of FIG. 2 showing $I_{OLED}^{driv}$ versus $V_{data}$ for different $W_3$.

FIG. 12 is a graph 1200 of simulation results of the pixel circuit 100 showing $I_{OLED}^{driv}$ 1202 versus $V_{data}$ 1204 for different $W_3$. FIG. 12 illustrates simulation results which confirm that increasing the size of the second variable capacitor 108 improves $I_{OLED}^{driv}$ 1202 without significantly affecting $\Delta V_{T,0}$-compensation.

Figure 13:
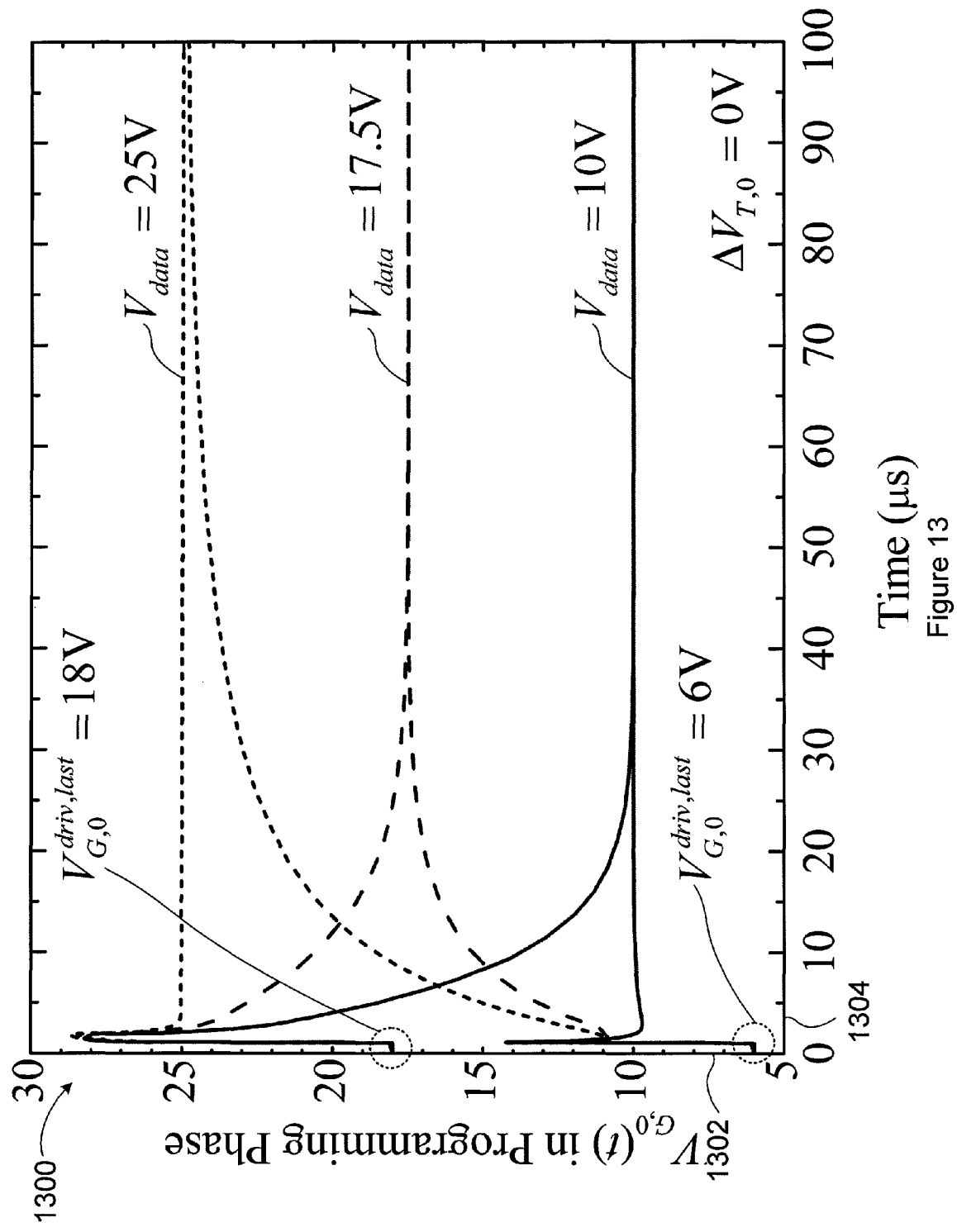
FIG. 13 is a graph of simulation results of the pixel circuit of FIG. 2 showing $V_{G,0}(t)$ for $\Delta V_{T,0}$=0V and different initial values of $V_{G,0}(t)$ in a programming phase.

FIG. 13 is a graph 1300 illustrating simulation results of the pixel circuit 100 showing $V_{G,0}(t)$ 1302 versus time 1304, for $\Delta V_{T,0}$=0V and different initial values of $V_{G,0}(t)$ in a programming phase 202. FIG. 13 illustrates the simulation results of $V_{G,0}(t)$ in the programming phase 202 to demonstrate the programming speed of the pixel circuit 100. The waveforms of $V_{G,0}(t)$ are dependent on the initial value of $V_{G,0}(t)$ in the programming phase 202, which is in turn the value of $V_{G,0}(t)$ after it reaching the set-point in the last driving phase 204 (denoted as $V_{G,0}^{driv,last}$). According to the simulation results shown in FIG. 15, for $\Delta V_{T,0}=0V$, $V_{G,0}^{driv}$ ranges from 6V to 18V, so the waveforms of $V_{G,0}(t)$ were simulated for $V_{G,0}^{driv,last}=6V$ and 18V, respectively. FIG. 13 shows that $V_{G,0}(t)$ settled down within 99% of $V_{data}$ in 90 µs. For the other corner $\Delta V_{T,0}=5V$, simulations verified the same conclusion. If the sizes of the devices (e.g., transistors, variable capacitors, or light-emitting device) are scaled down, the programming speed may increase.

Assuming the drive transistor 102 and load 110 (for example, OLED) have the typical sizes and the same stress conditions, referring to their degradation models and data, one can see that $\Delta V_{OLED}$ is much smaller than $\Delta V_{T,0}$. Due to the steep OLED I-V characteristic, the $\Delta V_{OLED}^{prog}$ caused by $\Delta V_{T,0}$ is negligible as shown in Equation 17.

$$dV_{OLED}^{prog}/dV_{T,0} \approx 0. \qquad \text{Eq. 17}$$

Figure 14:
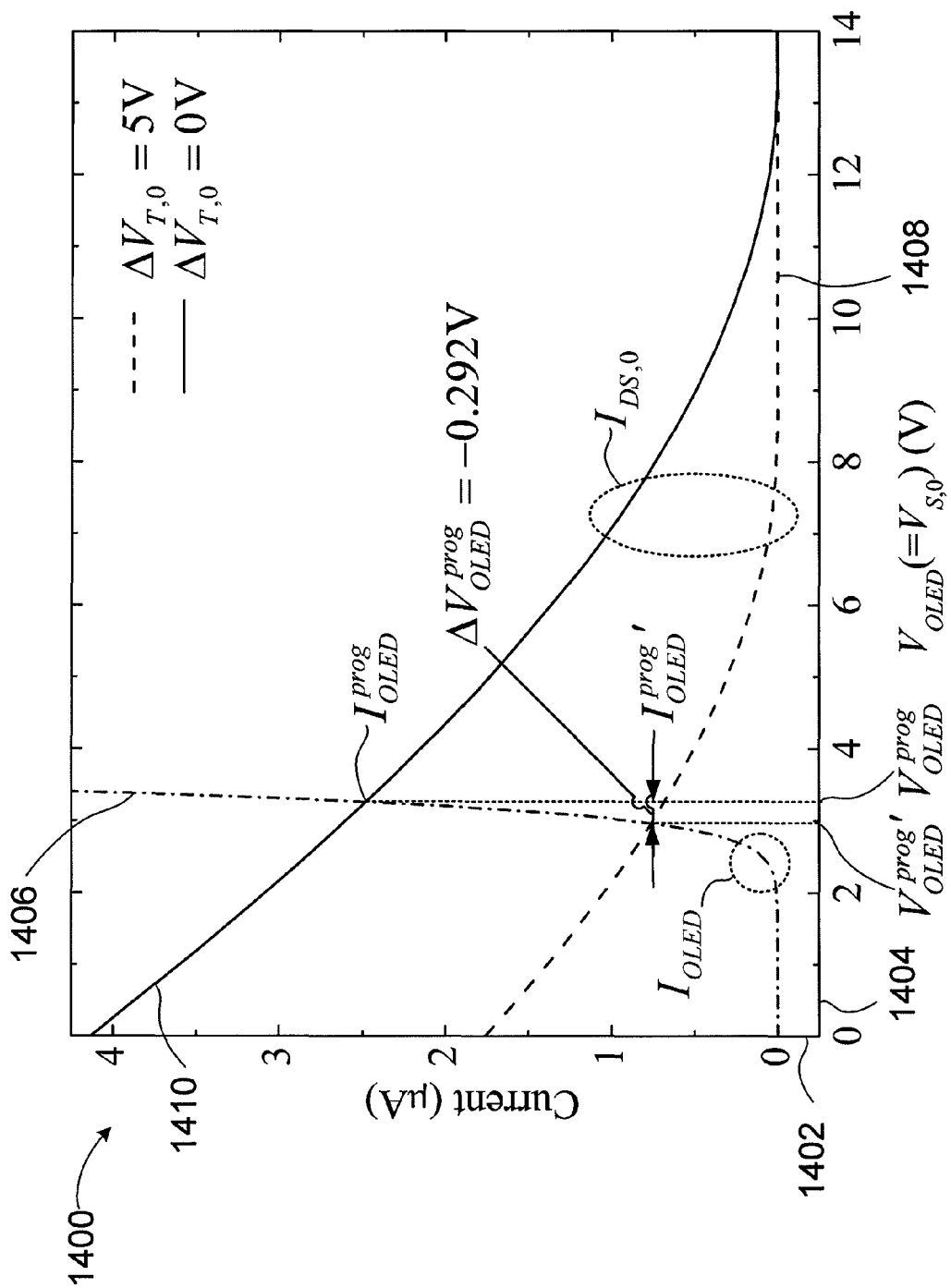
FIG. 14 is a graph of simulation results of the pixel circuit of FIG. 2 showing a significant $\Delta V_{T,0}$ leads to a small $\Delta V_{OLED}^{prog}$ due to steep OLED characteristic (for $V_{G,0}^{prog}$=16.7V)

FIG. 14 is a graph 1400 of simulation results of the pixel circuit 100 showing the following curves for $V_{G,0}^{prog}=16.7V$: (1) the curve of load current 1402 versus load voltage 1404 in the programming phase; and (2) the two curves of the drain-to-source current 1402 of the drive transistor (i.e., $I_{DS,0}$) versus the source voltage 1404 of the drive transistor (i.e., $V_{S,0}$) in the programming phase for $\Delta V_{T,0}=0V$ and $\Delta V_{T,0}=5V$, respectively. $V_{OLED}^{prog}$ ($I_{OLED}^{prog}$) and $V_{OLED}^{prog'}$ ($I_{OLED}^{prog'}$) are the load voltages (currents) in the programming phase 202 for $\Delta V_{T,0}=0V$ and 5V, respectively, and $\Delta V_{OLED}^{prog}=(V_{OLED}^{prog'}-V_{OLED}^{prog})$. For $\Delta V_{T,0}=5V$, FIG. 14 shows that $|\Delta V_{OLED}^{prog}|=0.292V$, which is only 5.84% of $\Delta V_{T,0}$, so Equation 17 is reasonable.

In the driving phase 204, assuming $\Delta V_{T,0}$ is already fully compensated, for the same $V_{data}$, $I_{OLED}^{driv}$ does not change with $\Delta V_{T,0}$, so $V_{OLED}^{driv}$ does not change with $V_{T,0}$ as shown in Equation 18.

$$dV_{OLED}^{driv}/dV_{T,0}=0. \qquad \text{Eq. 18}$$

For a practical display with N rows of pixels, the total stress time spent in the programming phases 202 is only 1/N of that spent in the driving phases 204. For a practical refresh rate (for example 60 Hz) the effects of negative pulse gate-to-channel stress voltages on $\Delta V_T$ are much smaller than those of positive pulse gate stress voltages. This implies that only the $\Delta V_T$ of the transistors 102, 104 and variable capacitors 106, 108 stressed by positive gate-to-channel voltages in the driving phase 204 need to be considered. Therefore, $\Delta V_{T,1}$ and $\Delta V_{T,3}$ can be considered as negligible when compared to $\Delta V_{T,0}$ and $\Delta V_{T,2}$ as shown in Equations 19 and 20.

$$dV_{T,1}/dV_{T,0} \approx 0.$$

$$dV_{T,3}/dV_{T,0} \approx 0. \qquad \text{Eq. 19, 20}$$

Since the gates of the drive transistor 102 and the first variable capacitor 106 are connected, their gate voltages are the same. Their source voltages in the driving phase 204 can be made approximately the same. $V_2^L$ is a fixed value provided by the row driver. $V_{OLED}^{driv}$ is not fixed because it depends on $V_{data}$. However, due to the steep OLED I-V curve, the variation range of $V_{OLED}^{driv}$ is much narrower than that of $V_{G,0}^{driv}$ is selected as a value close to $V_{OLED}^{driv}$, since $V_{GS,0}^{driv}=(V_{G,0}^{driv}-V_{OLED}^{driv})$ and $V_{GS,2}^{driv}=(V_{G,0}^{driv}-V_2^L)$ Equation 21 can be derived.

$$V_{GS,0}^{driv} \approx V_{GS,2}^{driv}. \qquad \text{Eq. 21}$$

Figure 15:
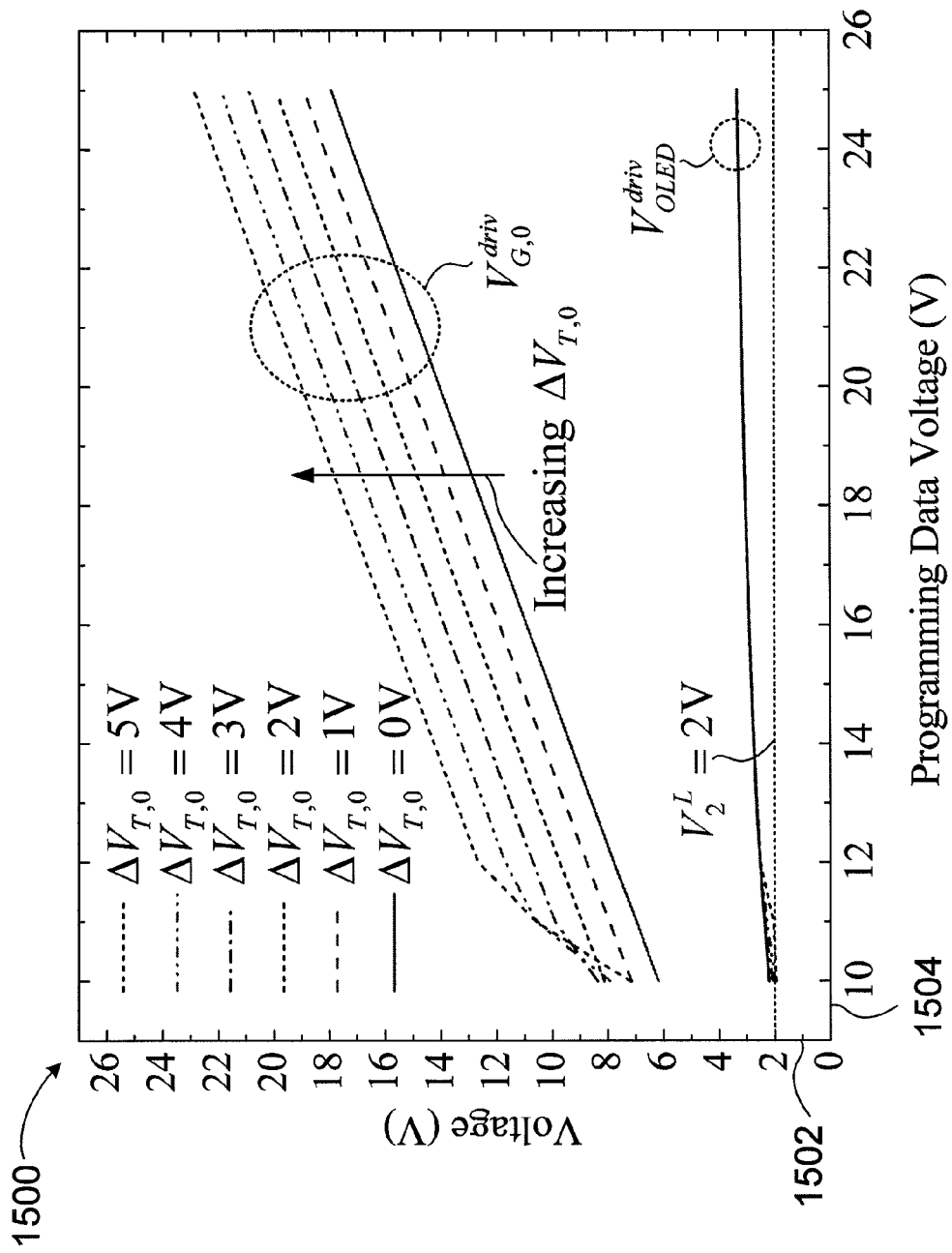
FIG. 15 is a graph of simulation results of the pixel circuit of FIG. 2 showing $V_{G,0}^{driv}$ and $V_{OLED}^{driv}$ versus $V_{data}$ and different $\Delta V_{T,0}$.

FIG. 15 is a graph 1500 of simulation results of the pixel circuit 100 showing $V_{G,0}^{driv}$ and $V_{OLED}^{driv}$ 1502 versus $V_{data}$ 1504. FIG. 15 justifies Equation 21 by simulated results. $V_2^L$ is selected as 2V to make it lower than but still close to the range of $V_{OLED}^{driv}$. This is to provide that $V_{GS,2}^{driv} \geq V_{G,0}^{driv}$ to make $V_{T,2}$ shift faster than $V_{T,0}$ in the pixel circuit 100.

Figure 16:
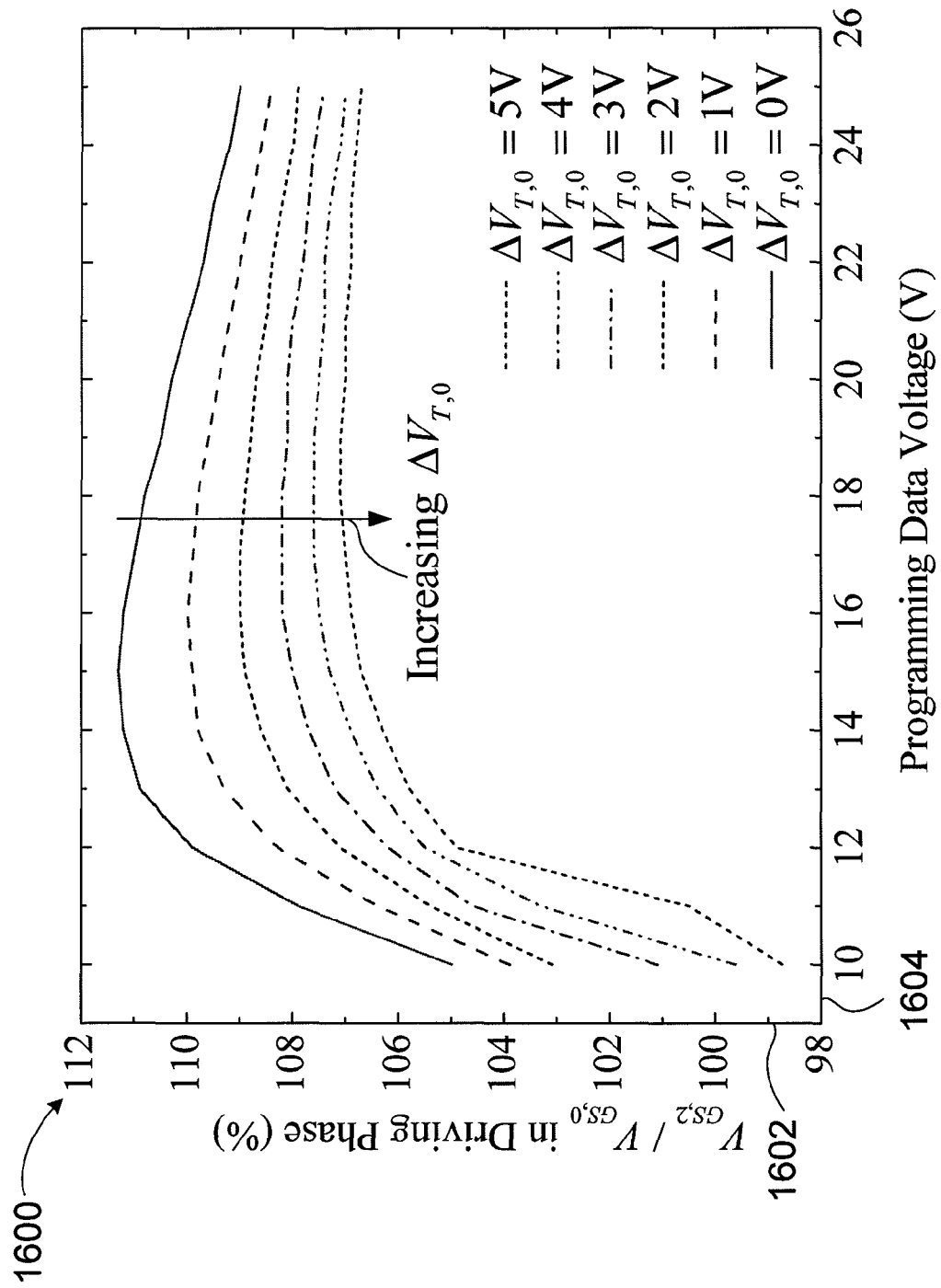
FIG. 16 is a graph of simulation results of the pixel circuit of FIG. 2 showing $V_{GS,2}^{driv}/V_{GS,0}^{driv}$ versus $V_{data}$ and different $\Delta V_{T,0}$.

FIG. 16 is a graph 1600 of simulation results of the pixel circuit 100 showing $V_{GS,2}^{driv}/V_{GS,0}^{driv}$ 1602 versus $V_{data}$ 1604. FIG. 16 shows that $V_{GS,0}^{driv}/V_{GS,0}^{driv}$ 1602 is around or lower than 1.1, so Equation 21 is justified.

$\Delta V_{T,0}$ and $\Delta V_{T,2}$ depend on the respective electrical stress history of the drive transistor 102 and the first variable capacitor 106. The transistor degradations caused by $V_{GS,0}^{prog}$ and $V_{GS,2}^{driv}$ can be neglected because of the short duration of the programming phase 202. In the driving phase 204, the drive transistor 102 is stressed in saturation mode, but the first variable capacitor 106 which is implemented, for example, as a TFT with the source and drain connected together, is stressed in triode mode. Since $V_{GS,0}^{driv} \approx V_{GS,2}^{driv}$ Equation 22 is given.

$$dV_{T,0}/dV_{T,2} \approx 2/3. \qquad \text{Eq. 22}$$

Substituting Equation 21 and 22 into Equation 11 yields Equation 23.

$$dV_{GS,2}^{driv}/dV_{T,2} \approx 2/3. \qquad \text{Eq. 23}$$

Figure 17:
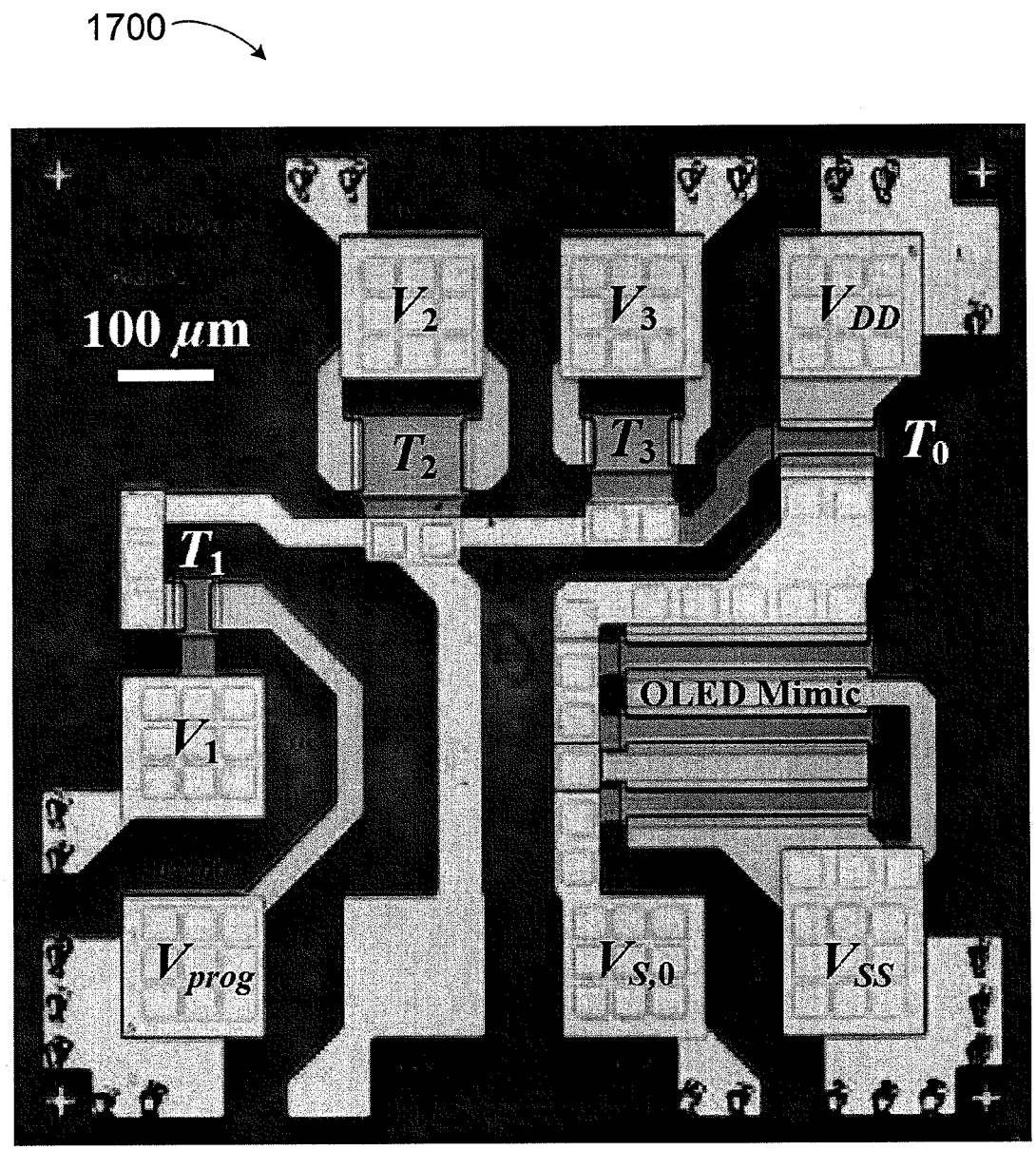
FIG. 17 is a photo of a fabricated sample of the pixel circuit of FIG. 2.

FIG. 17 illustrates an optical micrograph 1700 of a fabricated pixel circuit having the design of the pixel circuit 100, to verify $\Delta V_{T,0}$-compensation. In stress tests, $V_{DD}=20V$ and $V_{data}=15V$ were used. The low and high levels of the voltage signals $V_1$, $V_2$, $V_3$ were zero and 20V, respectively. Since the primary test purpose was to verify $\Delta V_{T,0}$-compensation, the OLED mimic (i.e., the diode-connected transistor) was excluded by setting $V_{SS}$ as open-circuit. $I_{DS,0}^{driv}$ was measured from pad $V_{S,0}$, whose level was kept at virtual ground. The measured $I_{DS,0}^{driv}$ before the stress test was 1.05 µA.

Figure 18:
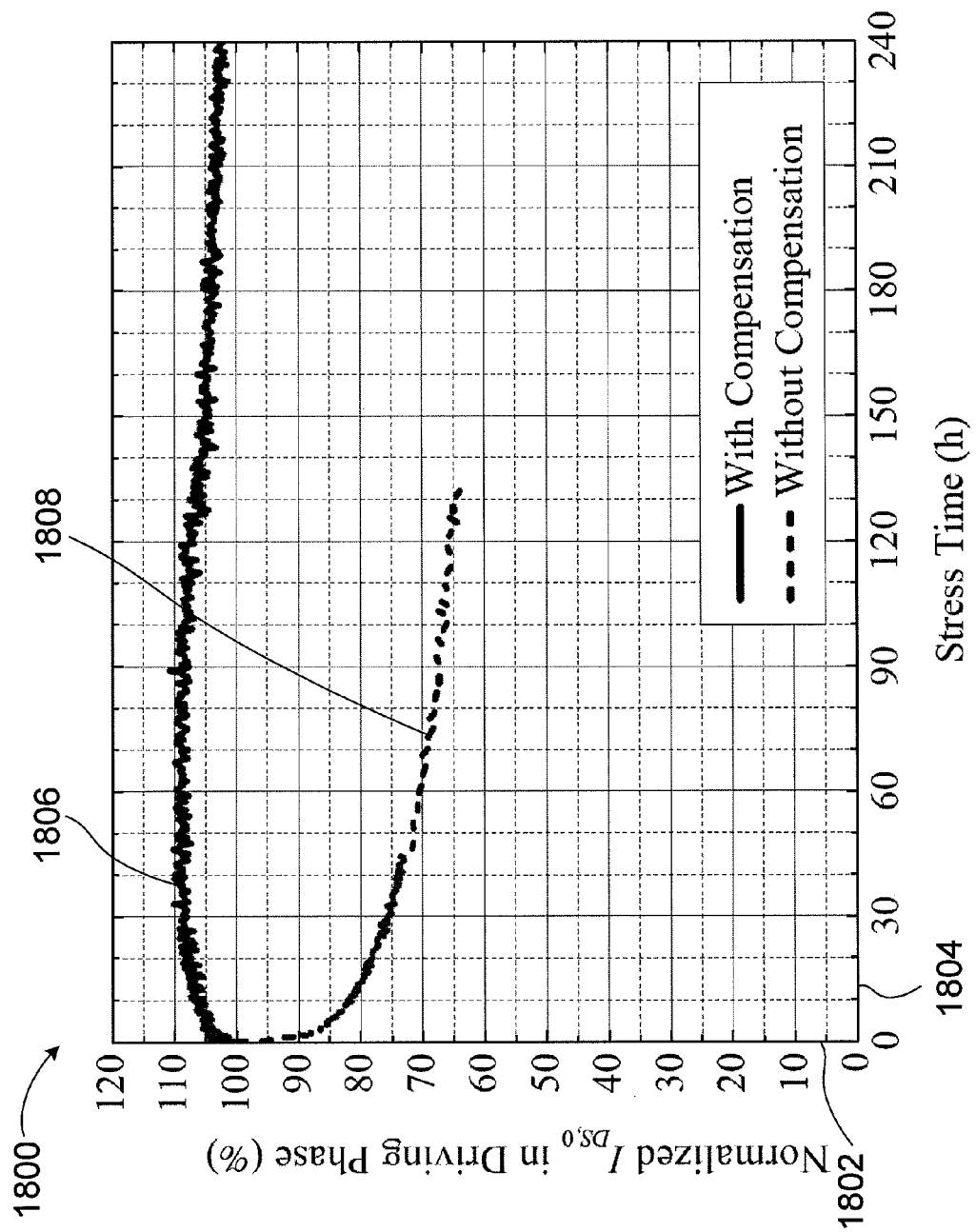
FIG. 18 is a graph of measurement results showing normalized $I_{DS,0}^{driv}$ versus stress time for the pixel circuit of FIG. 2 and a conventional voltage-programmed 2-transistor pixel circuit without $\Delta V_{T,0}$-compensation.

FIG. 18 is a graph 1800 of measurement results showing normalized $I_{DS,0}^{driv}$ 1802 versus stress time 1804 for the pixel circuit 100. For comparison, a stress test was carried out on another sample of the same pixel circuit design whose $\Delta V_{T,0}$-compensation was disabled by fixing $V_2$ and $V_3$ at 20V. Therefore, the sample acted like a conventional voltage programmed 2-transistor pixel circuit. To make the circuit also have the initial $I_{DS,0}^{driv}=1.05$ µA, its $V_{data}$ was set to 15.5V. The environment temperature of the stress tests was 40° C. FIG. 18 illustrates that the overall stability of the $I_{DS,0}^{driv}$ with $\Delta V_{T,0}$-compensation 1806 is improved over the one of the circuit without $\Delta V_{T,0}$-compensation 1808. Note that even with $\Delta V_{T,0}$-compensation 1806, $I_{DS,0}^{driv}$ still has some residual instability. It could be caused by some second-order effects, including non-zero $\Delta V_{T,1}$ and $\Delta V_{T,3}$, and/or minor variations of ($\Delta V_{T,2}/\Delta V_{T,0}$) throughout the test.

Figure 19:
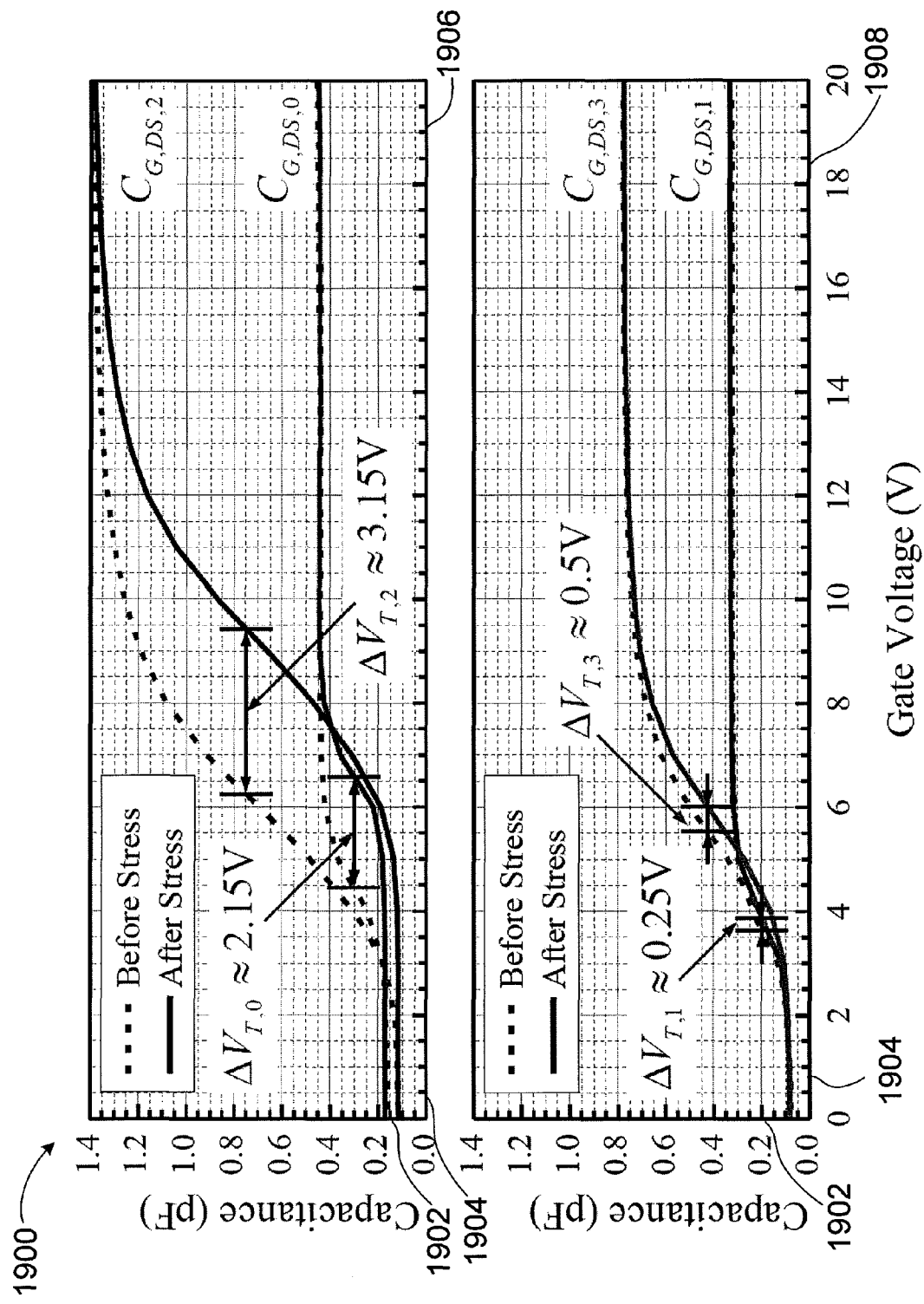
FIG. 19 is a graph of C-V measurement results of the TFTs in the pixel circuit of FIG. 2 before and after applying a 240-hour stress test.

FIG. 19 is a graph 1900 of measurement results of the capacitance 1902 versus voltage 1904 (C-V) characteristics of the transistors 102, 104, and the variable capacitors 106, 108 stressed with $\Delta V_{T,0}$-compensation, before and after the 240-hour stress test. The upper graph 1906 is for the C-V curves of the drive transistor 102 and the first variable capacitor 106. The lower graph 1908 is for the C-V curves of the switch transistor 104 and the second variable capacitor 108. The assumptions about the $\Delta V_T$ of transistors used in analysis were verified by the measurement results. As shown in FIG. 19, after a 240 h-stress test, $\Delta V_{T,0} \approx 2.15$ V and $\Delta V_{T,0} \approx 3.15V$, which illustrates that the ratio is close to the assumed 2/3. As $\Delta V_{T,1}$ and $\Delta V_{T,3}$ are much smaller than $\Delta V_{T,0}$ and $\Delta V_{T,2}$, it may be acceptable to neglect $\Delta V_{T,1}$ and $\Delta V_{T,3}$ in a first-order analysis.

Figure 20:
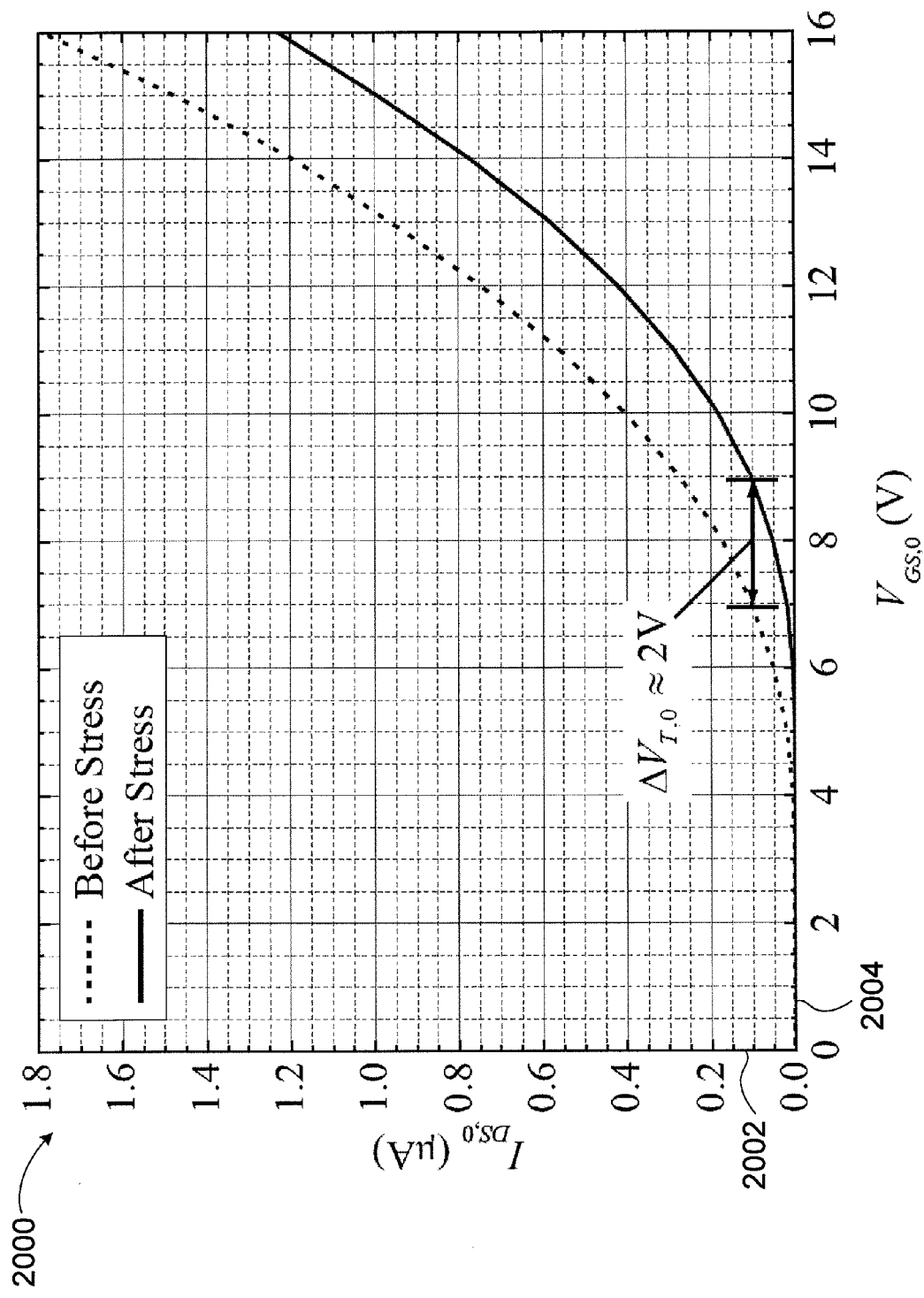
FIG. 20 is a graph of the measurement results of the transfer characteristics of the drive TFT in the pixel circuit of FIG. 2 before and after applying a 240-hour stress test.

FIG. 20 is a graph 2000 showing a measured transfer curves of the drive transistor 102 (i.e., $I_{DS,0}$ 2002 versus $V_{GS,0}$ 2004) in the circuit 100 stressed with $\Delta V_{T,0}$-compensation, before and after the 240-hour stress test. The extracted $\Delta V_{T,0} \approx 2$ V is close to the result from capacitance versus voltage (C-V) measurement. $\Delta V_{T,0}$ results in significant $I_{DS,0}$ drops if $\Delta V_{T,0}$-compensation is not used.

Figure 21:
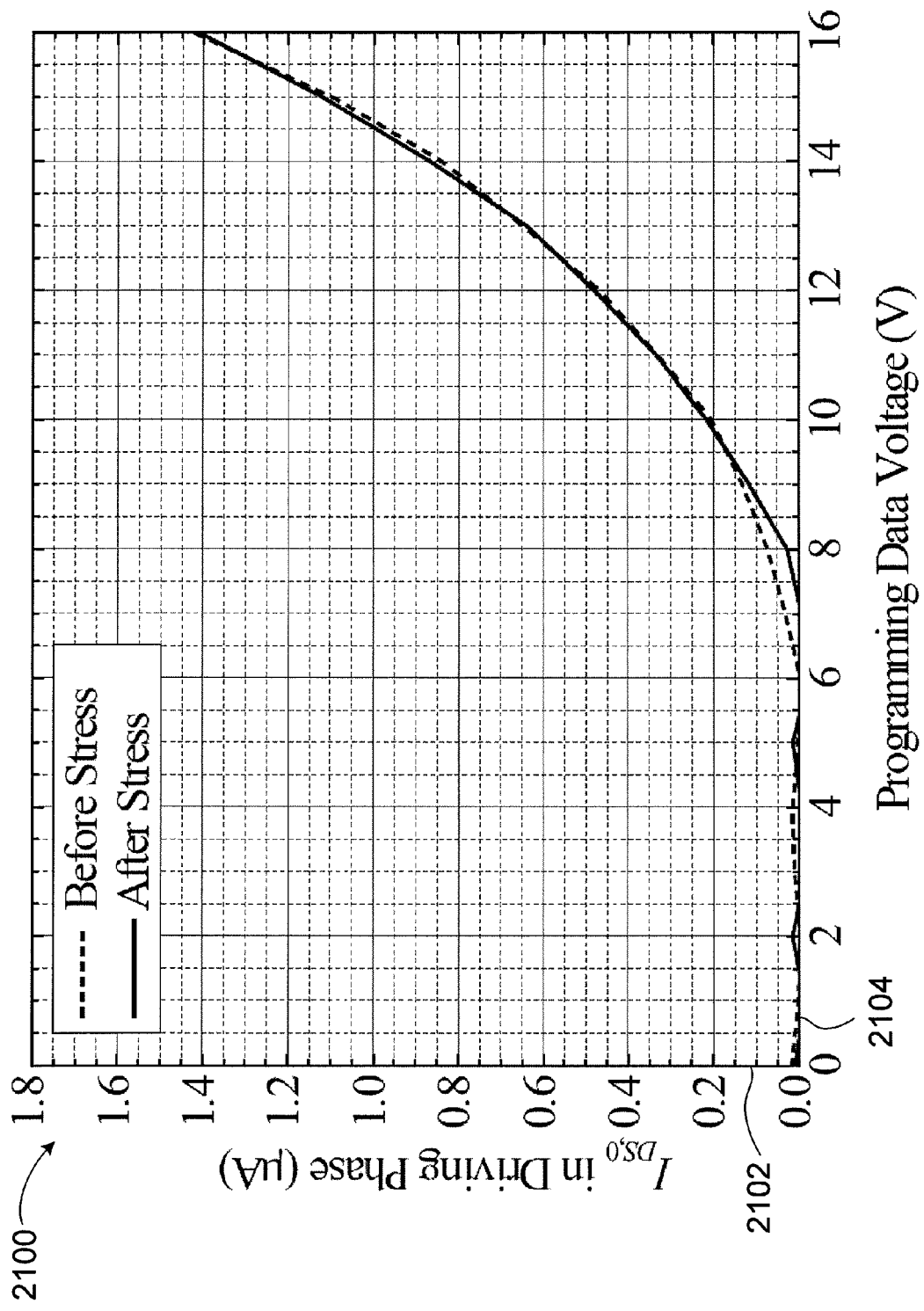
FIG. 21 is a graph of the measurement results of the $I_{DS,0}^{driv}$ versus $V_{data}$ of the pixel circuit of FIG. 2 before and after applying a 240-hour stress test.

FIG. 21 is a graph 2100 showing a measured $I_{DS,0}^{driv}$ 2102 versus $V_{data}$ 2104 of the pixel circuit 100 stressed with $\Delta V_{T,0}$-compensation, before and after the 240-hour stress test. FIG. 21 shows that, when $\Delta V_{T,0}$-compensation is used, except for the lowest $I_{DS,0}^{driv}$ levels, the $I_{DS,0}^{driv}$ differences caused by $\Delta V_{T,0}$ are insignificant. There is under-compensation on the lowest $I_{DS,0}^{driv}$ levels zero to 0.15 µA).

Figure 22:
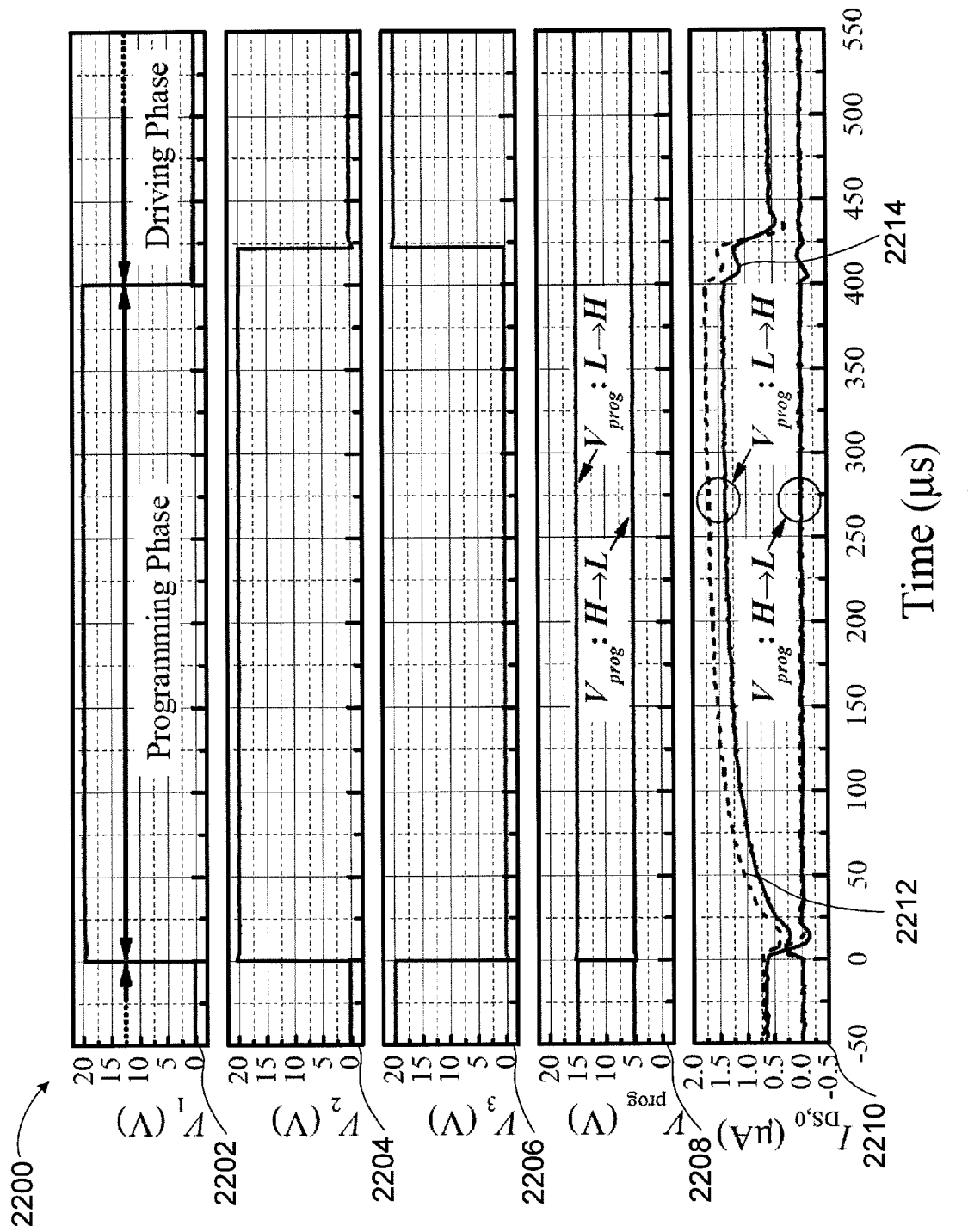
FIG. 22 is a graph of the measurement results of $V_1, V_2, V_3$, $V_{prog}$ (switching from high to low, and low to high, respectively), and the transient behaviors of $I_{ds,0}$ in the pixel circuit of FIG. 2 before and after applying a 240-hour stress test.

FIG. 22 is a graph 2200 of measurement results of $V_1$ 2202, $V_2$ 2204, $V_3$ 2206, $V_{prog}$ 2208 (switching from high level to low level (i.e., H→L), and low level to high level (i.e., L→H), respectively), and transient behavior of $I_{ds,0}$ 2210 in the pixel circuit 100 before and after applying a 240-hour stress test. As shown in FIG. 22, the programming speeds of the pixel sample with $\Delta V_{T,0}$-compensation were measured before 2212 and after 2214 the 240 h-stress test, for $V_{prog}$ going from 5V to 15V ($V_{prog}$: L→H) and from 15V to 5V ($V_{prog}$: H→L). In all cases, $I_{DS,0}$ 2210 in the programming phase 202 settled down within 95% of the final value in 250 µs.

The $\Delta V_T$ of the drive transistor 102 due to electrical stress is compensated by the change of gate-to-source voltage ($\Delta V_{gs}$) of the drive transistor 102 generated by the $\Delta V_T$-dependent charge transfer from the drive transistor 102 to the first variable capacitor 106. The charge injection from the second variable capacitor 108 to the gate of the drive transistor 102 in driving phase 204 improves the load drive currents 111. Advantages include that only one transistor is in series with the load 110, reducing static power consumption. The driving scheme 200 allows fast programming speed, simple control signals, and simple external driver. Since the pixel itself compensates the $\Delta V_T$ of the drive transistor 102, there is no need for the compensation from an external driver, reducing the design complexity. There may also be no need for optical feedback, avoiding problems with photo-sensor instability and light interference. As each pixel has its own $\Delta V_T$-compensation, higher resolution compensation may be achieved.

The structure of the pixel circuit 100 could be less complex compared to other compensation circuits and utilizes current manufacturing techniques. The driving scheme 200 of the pixel circuit 100 is also generally simplified compared to similar circuits intended for similar purposes.

The pixel circuit 100 is intended to compensate for electrical instability of the drive transistor 102 with fast programming speed, simple control signals, simple circuit structure, and low static power consumption, which are desirable for commercialization of various systems, such as AMOLED technology. The pixel circuit 100 may provide more uniform display brightness over large screens (e.g., AMOLED Television) and longer operational lifetimes for displays while using lower power consumption and potentially lower cost driver electronics. The pixel circuit 100 may be used in devices such as televisions, computer monitors, mobile-phone displays, near-eye displays, cameras, personal media players, medical displays, flexible displays, transparent displays, etc.

The pixel circuit 100 may reduce the cost of AMOLED display products while also increasing the pixel lifetime of AMOLED displays by providing compensation with faster programming speed. It may also be possible to use mature low-cost fabrication technology (e.g. amorphous silicon TFT) to produce large-size AMOLED display panels using this technology. The cost impact is intended to be negligible as integration of the pixel circuit 100 may not affect manufacturing or assembly costs.

The circuit 50 or 100 may be useful for any circuit in which a change of the gate voltage of a transistor is needed to compensate for instability/degradation/variation of the transistor.

Figure 23:
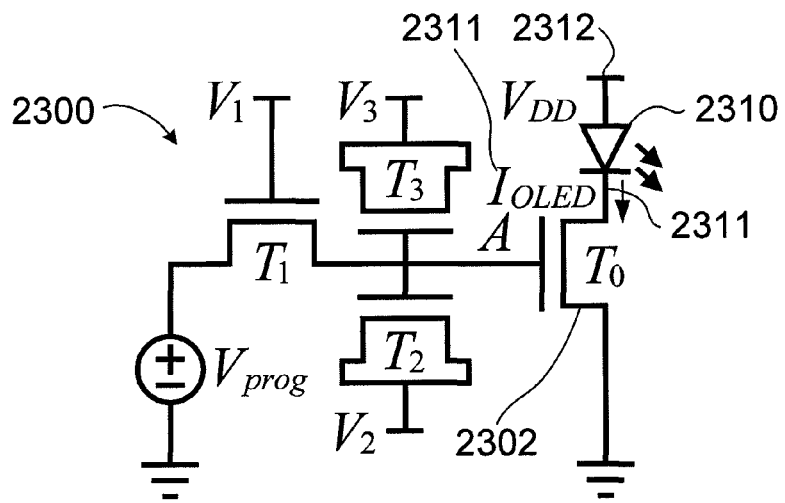
FIG. 23 illustrates a pixel circuit with a load between the drive transistor and the power supply (i.e., $V_{DD}$), in accordance with an embodiment.

FIG. 23 illustrates a circuit 2300, in accordance with a further embodiment. The circuit 2300 differs from the circuit 100 of FIG. 2 in that a load 2310 (e.g. an OLED) is placed between a power supply ($V_{DD}$) 2312 and the drive transistor ($T_0$) 2302. The driving scheme of the circuit 2300 is as described with reference to FIGS. 3 and 4. With the circuit 2300, the OLED instability does not affect the operation of the drive transistor 2302 so the stability of a load driving current 2311 may be improved.

Figure 24:
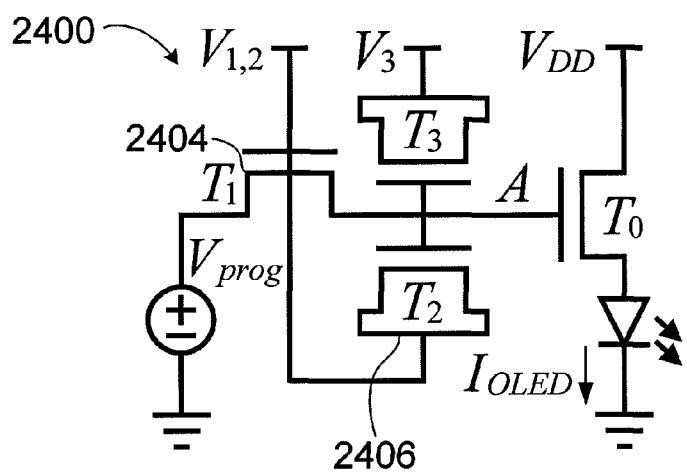
FIG. 24 illustrates a pixel circuit with a switch transistor and a first variable capacitor sharing a control signal, in accordance with an embodiment.
Figure 25:
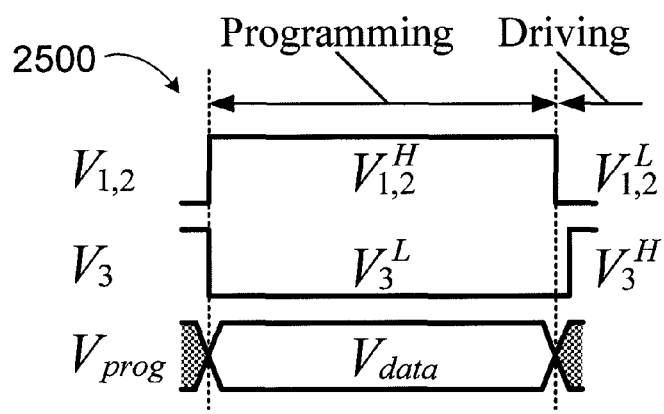
FIG. 25 illustrates a driving scheme for the pixel circuit of FIG. 24, in accordance with an embodiment.

FIGS. 24 and 25 illustrate a circuit 2400 and a driving scheme 2500, in accordance with another embodiment. The circuit 2400 has a switch transistor ($T_1$) 2404 and a first variable capacitor ($T_2$) 2406 sharing a common control signal $V_{1,2}$. The circuit 2400 saves one bus line in the row direction, so the aperture ratio of a display panel may be improved and the design of row/scan driver may be further simplified.

FIGS. 26 and 27 illustrate a circuit 2600 and a driving scheme 2700, in accordance with yet another embodiment. The circuit 2600 has a drive transistor ($T_0$) 2602 and a second variable capacitor ($T_3$) 2608 sharing a common control signal $V_{DD}$ 2611. The circuit 2600 saves one bus line for each row of pixels, so the aperture ratio of a display panel may be improved.

Figures 28, 29:
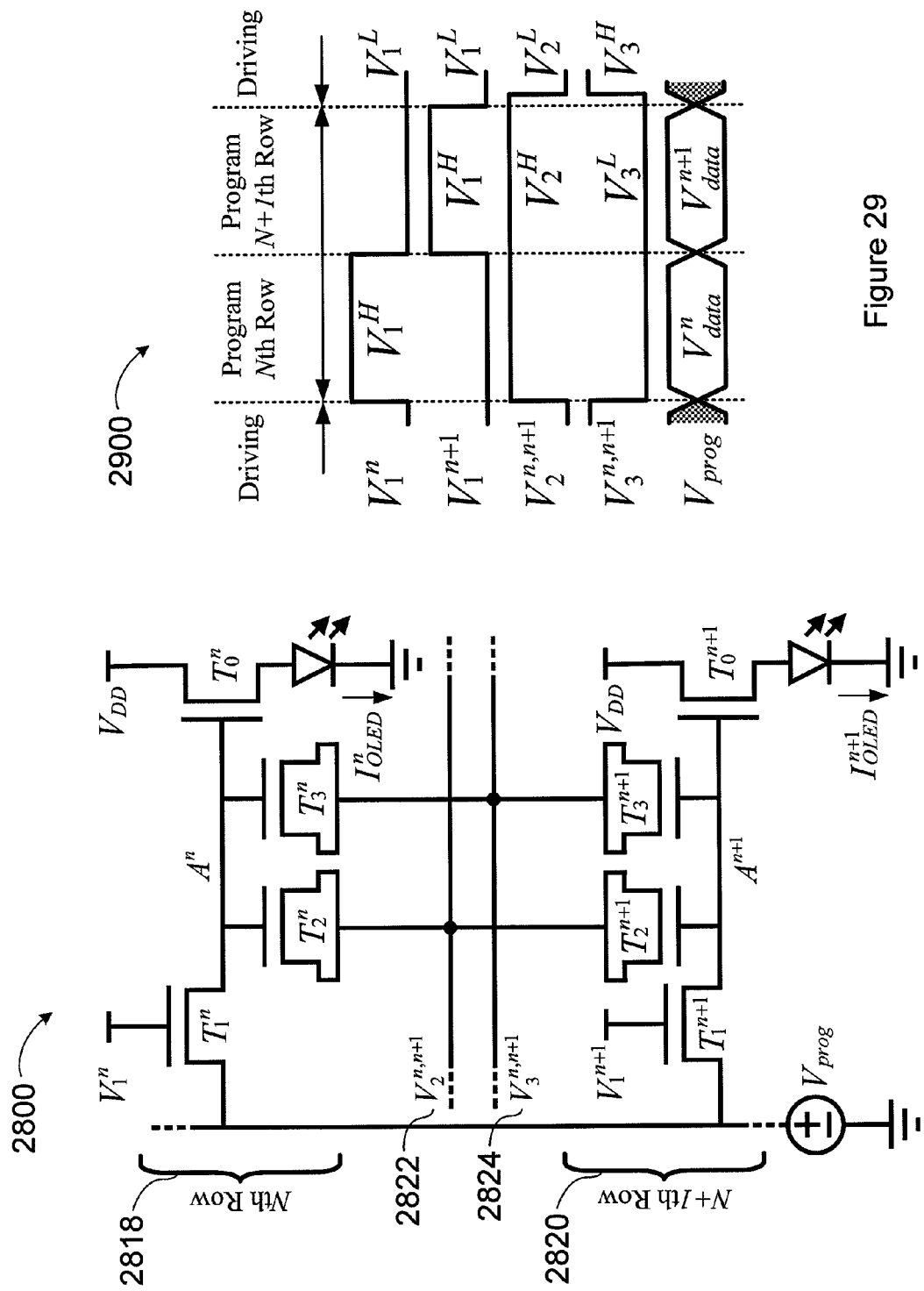
FIG. 28 illustrates a pixel circuit with two rows of pixels sharing control signals, in accordance with an embodiment.
FIG. 29 illustrates a driving scheme for the pixel circuit of FIG. 28, in accordance with an embodiment.

FIGS. 28 and 29 illustrate an array 2800 and a driving scheme 2900, in accordance with another embodiment. The array 2800 has every two neighboring rows of pixels 2818, 2820 sharing $V_2$ 2822 and $V_3$ 2824. The circuit 2800 saves two bus lines for every two rows of pixels 2818, 2820, so the aperture ratio of a display panel may be improved.

Figure 30:
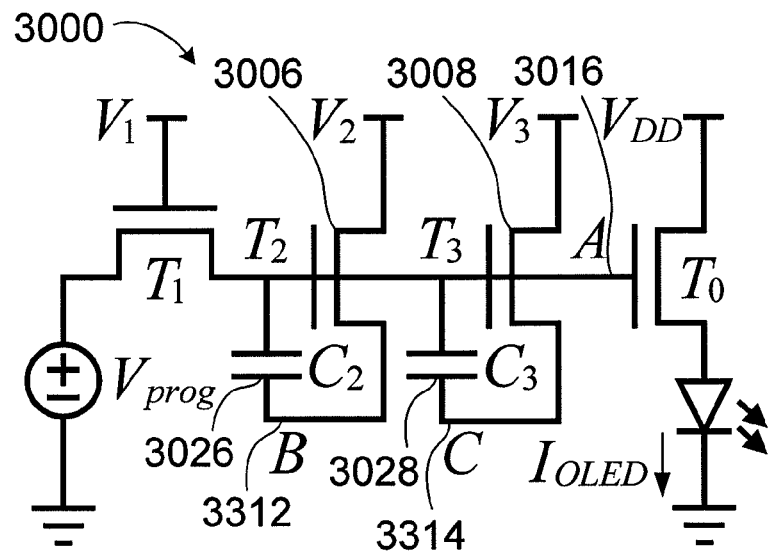
FIG. 30 illustrates a pixel circuit having first and second capacitors regulated respectively by third and fourth transistors, in accordance with an embodiment.

FIG. 30 illustrates a circuit 3000, in accordance with another embodiment. The circuit 3000 includes a first capacitor 3026 ($C_2$) and a second capacitor 3028 ($C_3$) which are respectively regulated by third and fourth transistors 3006, 3008. The first and second capacitors 3026, 3028 may be non-variable capacitors, metal-insulator-metal capacitors, MIS capacitors, or other types of capacitors. The driving scheme of the circuit 3000 is as described with reference to FIGS. 3 and 4.

The first variable capacitor 56 in the electrical stability compensation apparatus 50 may be implemented as a combination of the first capacitor 3026 and the third transistor 3006. In the combination of the first capacitor 3026 and the third transistor 3006, a first terminal of the first capacitor 3026 is connected to a source of the third transistor 3006. The source of the third transistor 3006 is connected to node B 3312 in circuit 3000. A second terminal of the first capacitor 3026 is connected to a gate of the third transistor 3006. The gate of the third transistor 3006 is connected to node A 3016 in circuit 3000. The gate of the first variable capacitor 56 in the electrical stability compensation apparatus 50 may be implemented as the gate of the third transistor 3006. The source of the first variable capacitor 56 in the electrical stability compensation apparatus 50 may be implemented as the drain of the third transistor 3006, which is connected to $V_2$ in circuit 3000.

The second variable capacitor 58 in the electrical stability compensation apparatus 50 may be implemented as a combination of the second capacitor 3028 and the fourth transistor 3008. In the combination of the second capacitor 3028 and the fourth transistor 3008, a first terminal of the second capacitor 3028 is connected to a source of the fourth transistor 3008. The source of the fourth transistor 3008 is connected to node C 3314 in circuit 3000. A second terminal of the second capacitor 3028 is connected to a gate of the fourth transistor 3008. The gate of the fourth transistor 3008 is connected to node A 3016 in circuit 3000. The gate of the second variable capacitor 58 in the electrical stability compensation apparatus 50 may be implemented as the gate of the fourth transistor 3008. The source of the second variable capacitor 58 in the electrical stability compensation apparatus 50 may be implemented as the drain of the fourth transistor 3008, which is connected to $V_3$ in circuit 3000.

As the first capacitor 3026 is used, the channel area of the third transistor 3006 may be much smaller without affecting the $\Delta V_{T,0}$ compensation capability. The channel length of the third transistor 3006 may be much shorter than the length of the first variable capacitor 106 of the circuit 100. Since the channel length of the third transistor 3006 may be shorter, the response speed of the first variable capacitor 56 in the electrical stability compensation apparatus 50 implemented as the combination of the first capacitor 3026 and the third transistor 3006 may be faster than that of the first variable capacitor 56 in the electrical stability compensation apparatus 50 implemented as the first variable capacitor 106, so the programming speed of the circuit 3000 may be faster than that of circuit 100. Between a node A 3016 and $V_2$, the third transistor 3006 of the circuit 3000 has only one overlap capacitor (therefore, smaller overlap capacitance) when compared with the first variable capacitor 106 of the circuit 100, which has two overlap capacitors (therefore, larger overlap capacitance). The impact of the overlap capacitance of the third transistor 3006 in the circuit 3000 may have less impact on the $\Delta V_{T,0}$-compensation than the impact on $\Delta V_{T,0}$-compensation from the overlap capacitance of the first variable capacitor 106 in the circuit 100. Similarly, the above analysis applies to the second variable capacitor 58 in the electrical stability compensation apparatus 50 implemented as the combination of the second capacitor 3028 and the fourth transistor 3008 of the circuit 3000.

A benefit of using the combination of the second capacitor 3028 and the fourth transistor 3008 may be to avoid the $V_T$-shift of the fourth transistor 3008 ($\Delta V_{T,3}$). In the circuit 100, the second variable capacitor 108 is stressed by $V_{GS,3}^{driv} \neq V_{T,3}$ in the driving phase, resulting in $\Delta V_{T,3}$. Although $\Delta V_{T,3}$ is much less significant than $\Delta V_{T,0}$, it may have some minor impact on $\Delta V_{T,0}$-compensation. However, in the circuit 3000, the fourth transistor 3008 is stressed by $V_{GS,3}^{driv} \approx \Delta V_{T,3}$, so $\Delta V_{T,3}$ is avoided.

Figure 31:
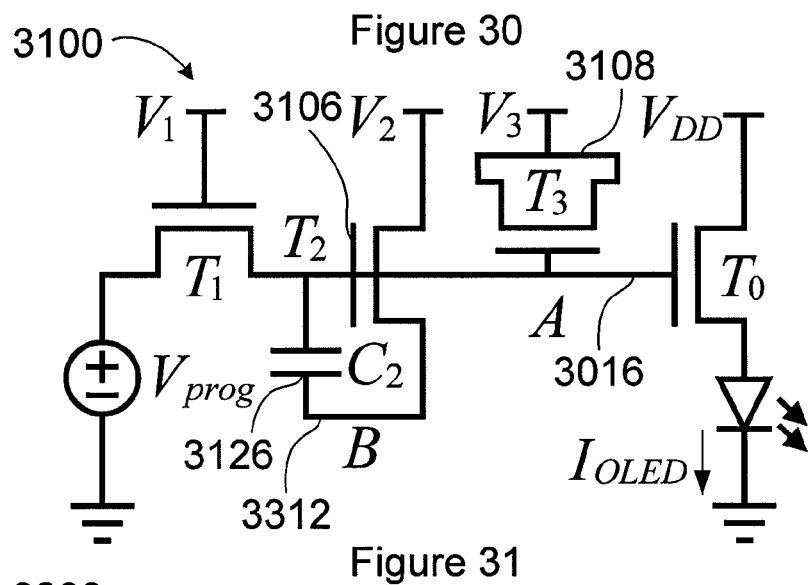
FIG. 31 illustrates a pixel circuit having a capacitor regulated by a third transistor, in accordance with an embodiment.

FIG. 31 illustrates a circuit 3100, in accordance with yet another embodiment. The circuit 3100 includes a first capacitor 3126, a third transistor 3106, and a variable capacitor 3108 ($T_3$). As described with reference to FIG. 30, the circuit 3100 is intended to have similar advantages from the first variable capacitor 56 in the electrical stability compensation apparatus 50 implemented as the combination of the first capacitor 3026 and the third transistor 3006 transistor.

Figure 32:
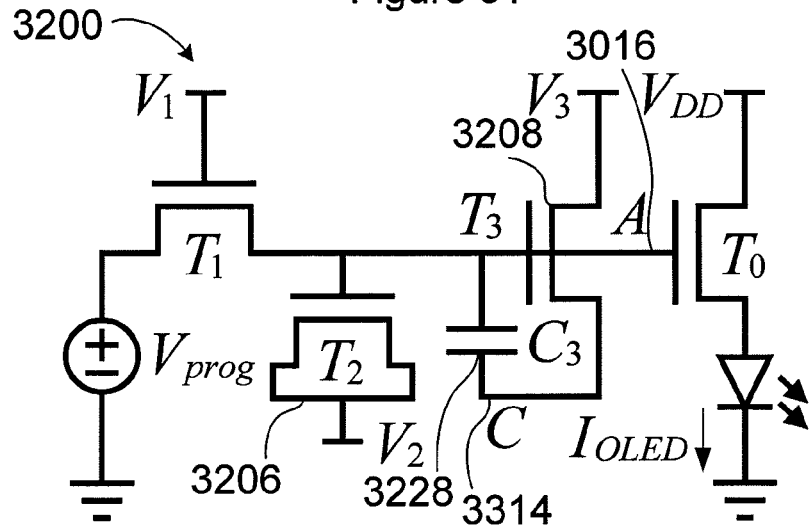
FIG. 32 illustrates a pixel circuit a capacitor regulated by a fourth transistor, in accordance with an embodiment.

FIG. 32 illustrates a circuit 3200, in accordance with still yet another embodiment. The circuit 3200 includes a first capacitor 3228, a fourth transistor 3208, and a variable capacitor 3206 ($T_2$). As described with reference to FIG. 30, the circuit 3200 is intended to have similar advantages from the second variable capacitor 58 in the electrical stability compensation apparatus 50 implemented as the combination of the second capacitor 3028 and the fourth transistor 3008.

Figure 33:
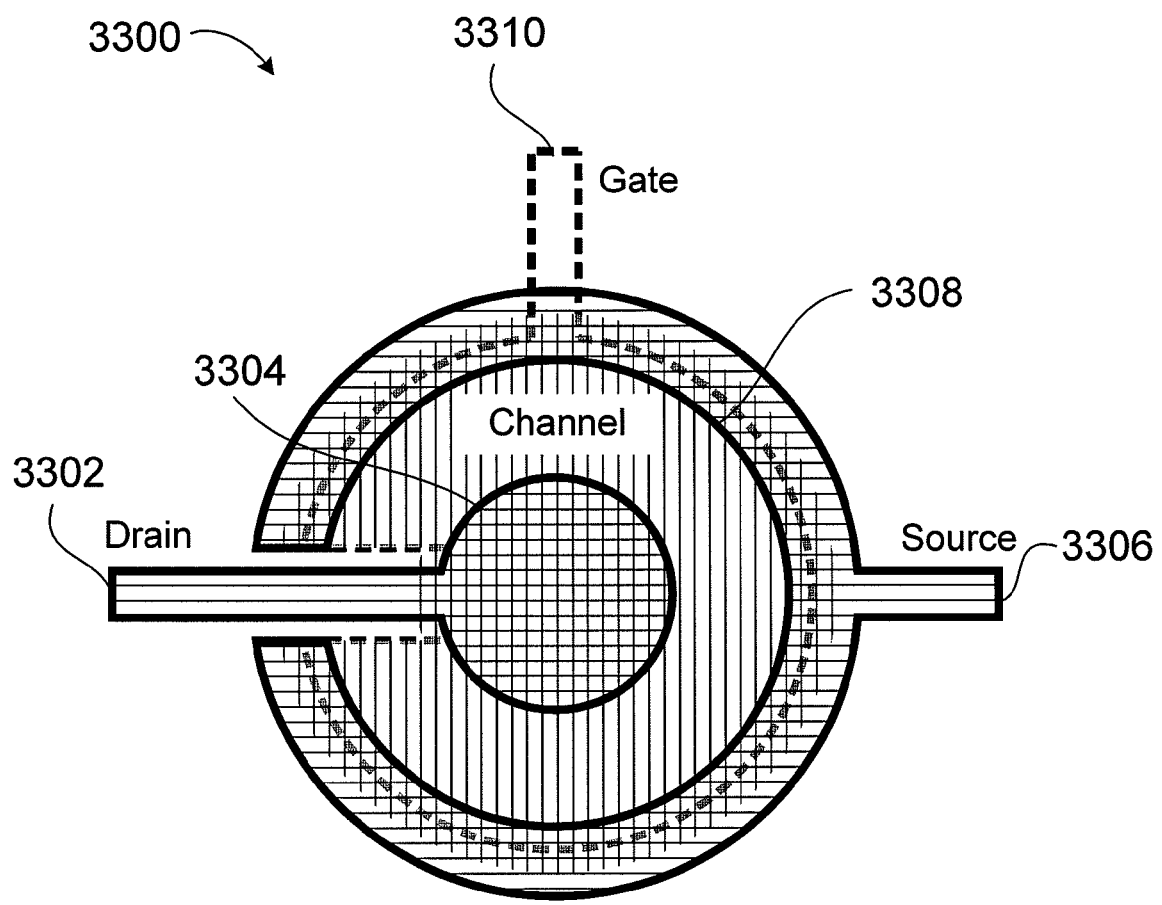
FIG. 33 illustrates an asymmetrical transistor, in accordance with an embodiment.

FIG. 33 illustrates an asymmetrical transistor 3300 with an asymmetrical drain and source structure when used in the above embodiments. The transistor 3300, such as a TFT, may further reduce transistor overlap capacitances associated to node A so as to decrease the impact of the overlap capacitances on the $\Delta V_{T,0}$-compensation. At a drain side 3302, a shorter channel width 3304 (i.e., the shorter perimeter of the circular electrode of the drain terminal) leads to smaller overlap capacitance associated to drain terminal 3302. At a source side 3306, a longer channel width 3308 (i.e., the longer perimeter of the circular electrode of the source terminal) provides the asymmetrical transistor 3300 with enough current driving capability to meet its design needs. Note that the asymmetrical transistor 3300 can also be implemented with other shapes such as square, rectangle, hexagonal, octagonal, etc. as is known in the art. The asymmetrical transistor 3300 may be used as the switch transistor ($T_1$) 104 of FIG. 2 to reduce the overlap capacitance of the switch transistor 104 associated to node A 116, with the drain terminal 3302 connected to node A 116, the source terminal 3306 connected to the bus line of $V_{prog}$ 114, and a gate terminal 3310 connected to the bus line of $V_1$.

The asymmetrical transistor 3300 may also be used as the third and/or fourth transistors 3006, 3008, 3106, 3208 of the circuits 3000, 3100, 3200. Where the asymmetrical transistor 3300 is used as the third and/or fourth transistors 3006, 3008, 3106, 3208, the source terminal 3306 is connected to node B 3312 (or node C 3314), the drain terminal 3302 is connected to $V_2$ (or $V_3$), and the gate terminal is connected to node A 3016.

It will be understood that various other embodiments will be apparent to one of skill in the art after review of the example embodiments described with reference to FIGS. 23-33.

In the preceding description, for purposes of explanation, numerous details are set forth in order to provide a thorough understanding of the embodiments. However, it will be apparent to one skilled in the art that these specific details may not be required. In other instances, well-known electrical structures and circuits may be shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. An apparatus for electrical stability compensation comprising:
   a drive transistor connecting a power supply to a load;
   a first variable capacitor having a gate and a source; and
   a switch transistor for controlling a connection between a programming signal source and a gate of the drive transistor;
   wherein the gate of the first variable capacitor is connected to the gate of the drive transistor and the first variable capacitor is configured to draw a charge from the gate of the drive transistor during a driving phase for the load.

2. The apparatus of claim 1 further comprising:
   a second variable capacitor having a gate and a source;
   wherein the gate of the second variable capacitor is connected to the gate of the drive transistor and the variable capacitor is configured to inject a charge to the gate of the drive transistor during the driving phase.

3. The apparatus of claim 1, wherein the first variable capacitor comprises a transistor in which a source and a drain are shorted.

4. The apparatus of claim 3, wherein the transistor is an asymmetrical transistor.

5. The apparatus of claim 1, wherein the first variable capacitor comprises a capacitor and a transistor, wherein the capacitor is connected between a source and gate of the transistor and a gate of the transistor is connected to the gate of the drive transistor.

6. The apparatus of claim 1, wherein the gate and source of the first variable capacitor are determined based on a dependence of the capacitance of the first variable capacitor to the gate to source voltage and the threshold voltage.

7. The apparatus of claim 2, wherein the second variable capacitor comprises a transistor in which a source and a drain are shorted.

8. The apparatus of claim 7, wherein the transistor is an asymmetrical transistor.

9. The apparatus of claim 2, wherein the second variable capacitor comprises a capacitor and a transistor wherein the capacitor is connected between a source and gate of the transistor and a gate of the transistor is connected to the gate of the drive transistor.

10. The apparatus of claim 2, wherein the gate and source of the second variable capacitor are determined based on a dependence of the capacitance of the second variable capacitor to the gate to source voltage and the threshold voltage.

11. The apparatus of claim 1, wherein the drive transistor is an asymmetrical transistor.

12. The apparatus of claim 1, wherein the load comprises a light emitting element.

13. The apparatus of claim 12, wherein the light emitting element comprises an organic light emitting diode (OLED).

14. A method for electrical stability compensation comprising:
   providing a programming phase during which:
      a programming signal is provided to a gate of the drive transistor; and
      a charge is released from a first variable capacitor; and
   providing a driving phase during which:
      a charge is drawn from a gate of the drive transistor by the first variable capacitor.

15. The method of claim 14 further comprising:
   during the programming phase:
      a charge is stored in a second variable capacitor; and
   during the driving phase:
      a charge is injected to the gate of the drive transistor by the second variable capacitor.

16. The method of claim 14, wherein the load comprises a light emitting element.

17. An apparatus for electrical stability compensation comprising:
   a drive transistor connecting a power supply to a load;
   a first variable capacitor comprising a transistor in which a source and a drain to provide a gate and a source, wherein the gate of the first variable capacitor is connected to the gate of the drive transistor and the first variable capacitor is configured to draw a charge from the gate of the drive transistor during a driving phase for the load;
   a second variable capacitor comprising a transistor in which a source and a drain to provide a gate and a source, wherein the gate of the second variable capacitor is connected to the gate of the drive transistor and the variable capacitor is configured to inject a charge to the gate of the drive transistor during the driving phase; and
   a switch transistor for controlling a connection between a programming signal source and a gate of the drive transistor.

* * * * *